(12) United States Patent
Vann et al.

(10) Patent No.: US 6,844,787 B2
(45) Date of Patent: Jan. 18, 2005

(54) METHOD AND APPARATUS FOR RE-MODULATION USING ZERO IF

(75) Inventors: Emerick Vann, Dublin, CA (US); Robert Hantz, Fremont, CA (US)

(73) Assignee: Stratex Networks, Inc., San Jose, CA (US)

(*) Notice: Subject to any disclaimer, the term of this patent is extended or adjusted under 35 U.S.C. 154(b) by 165 days.

(21) Appl. No.: 10/350,468

(22) Filed: Jan. 23, 2003

(65) Prior Publication Data

US 2004/0051598 A1 Mar. 18, 2004

Related U.S. Application Data

(60) Provisional application No. 60/410,567, filed on Sep. 13, 2002.

(51) Int. Cl.[7] ................................................ H04B 1/00
(52) U.S. Cl. ........................ 332/103; 375/259; 375/261; 455/39; 455/42; 455/71
(58) Field of Search ................................. 332/103–105; 375/259–261, 268–272, 279; 455/39, 42–48, 500, 59–61, 66, 68, 70–72

(56) References Cited

U.S. PATENT DOCUMENTS

RE31,295 E * 6/1983 Haley et al. ................ 370/481

* cited by examiner

*Primary Examiner*—David Mis
(74) *Attorney, Agent, or Firm*—Leah Sherry; Guadalupe Garcia; Dechert LLP

(57) ABSTRACT

The present invention provides for a first modulation at an arbitrary frequency and a second modulation at another arbitrary frequency. To achieve this, the present invention demodulates the first modulation using the same reference oscillator signal that was used in the first modulation. Because modulation and demodulation are achieved using the same reference oscillator signal, a close approximation of the original signals is achieved. With this close approximation, a subsequent re-modulation can be readily achieved at a second arbitrary frequency and can further be achieved using low-cost synthesizer and modulation components. In effect, a first modulation is achieved at a first frequency; the first modulation is then demodulation to zero frequency; and, in turn, a second modulation (i.e., re-modulation) is achieved at a second frequency.

52 Claims, 21 Drawing Sheets

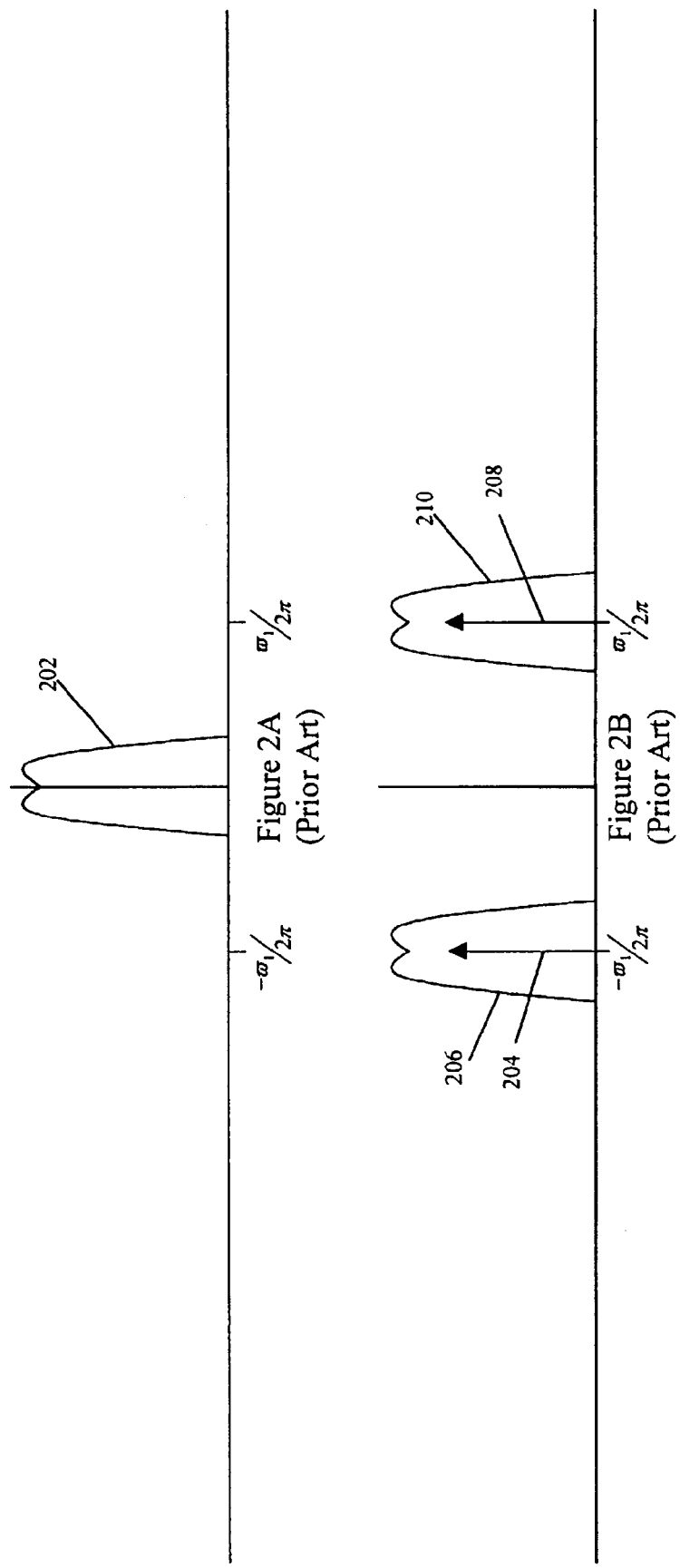

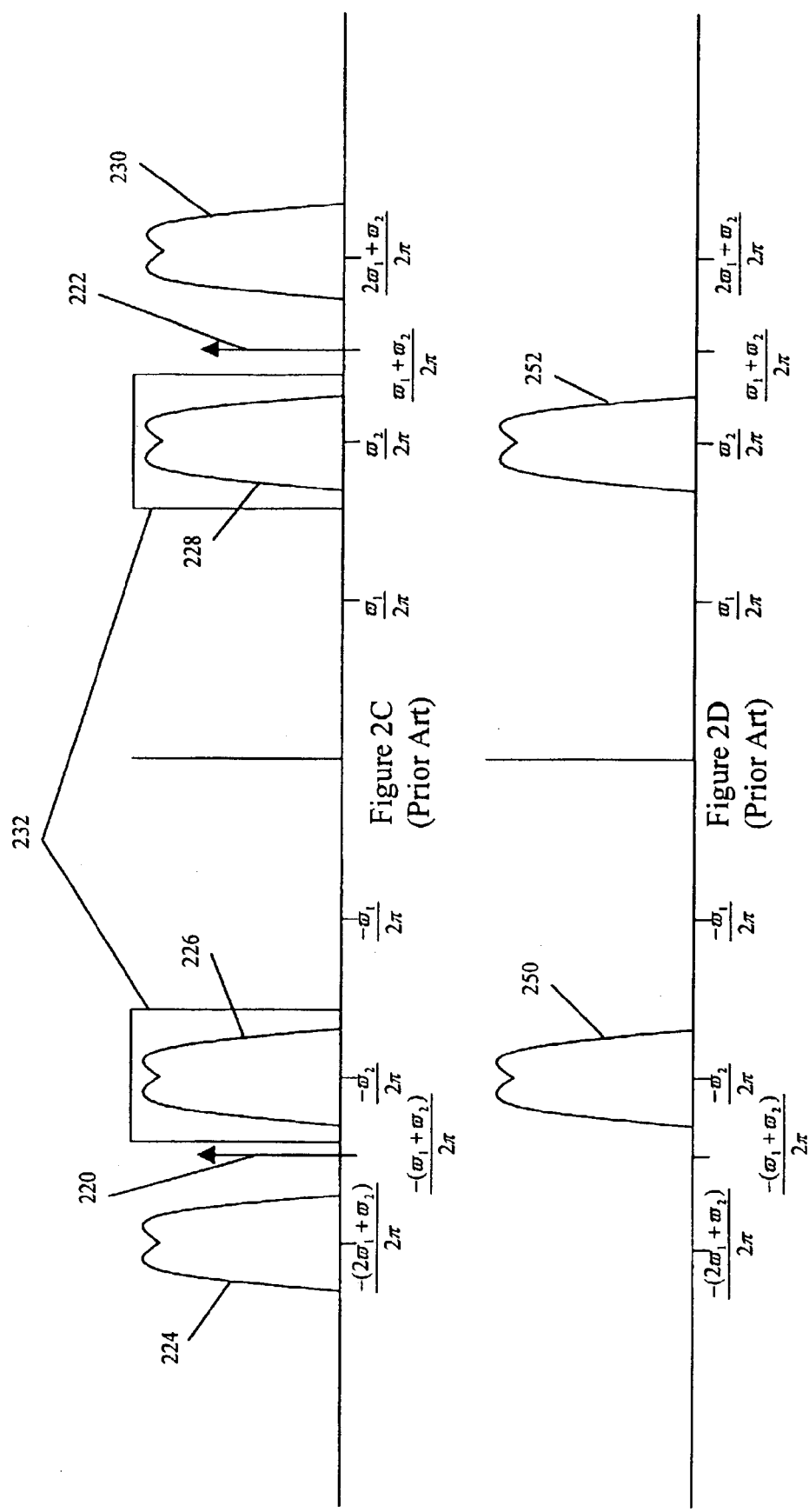

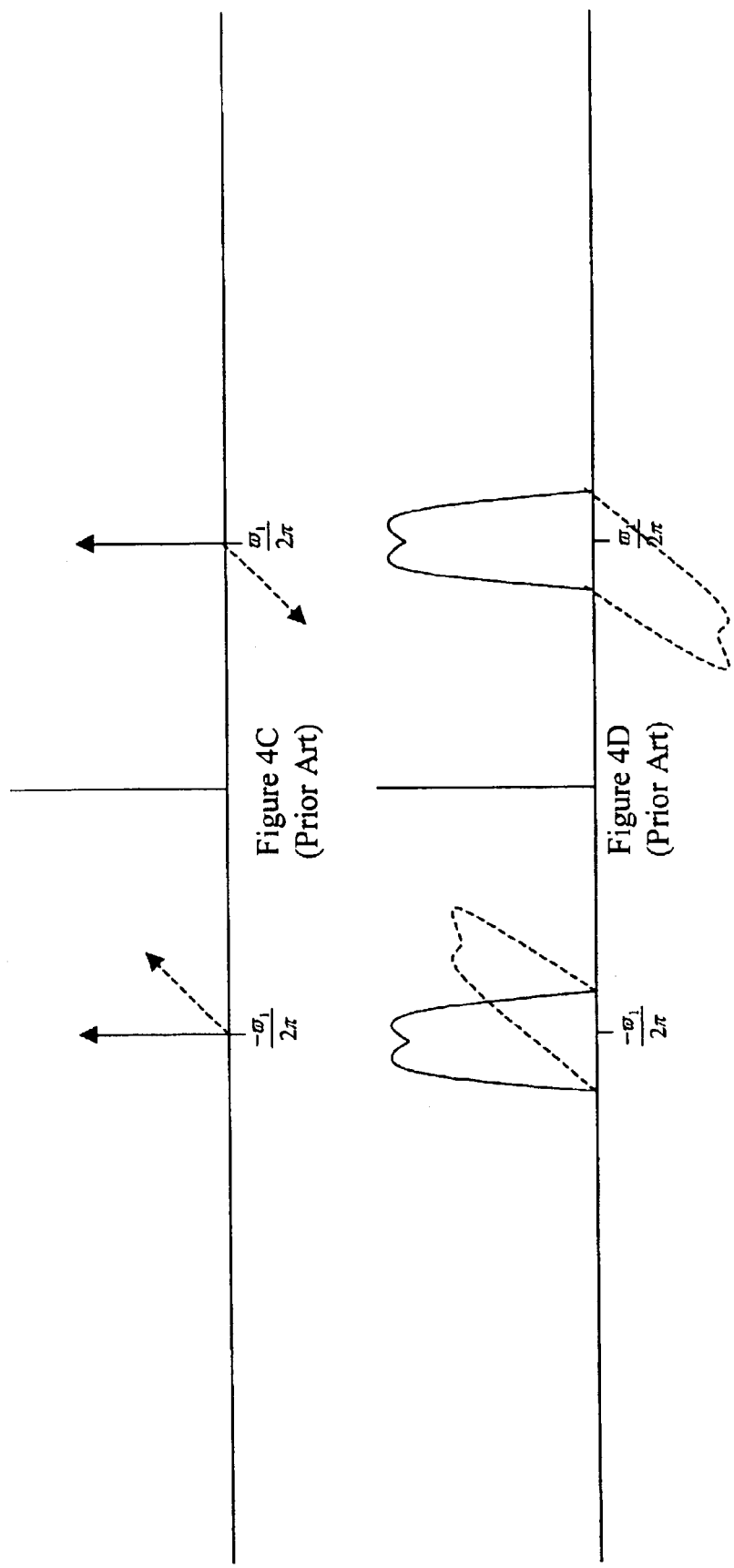

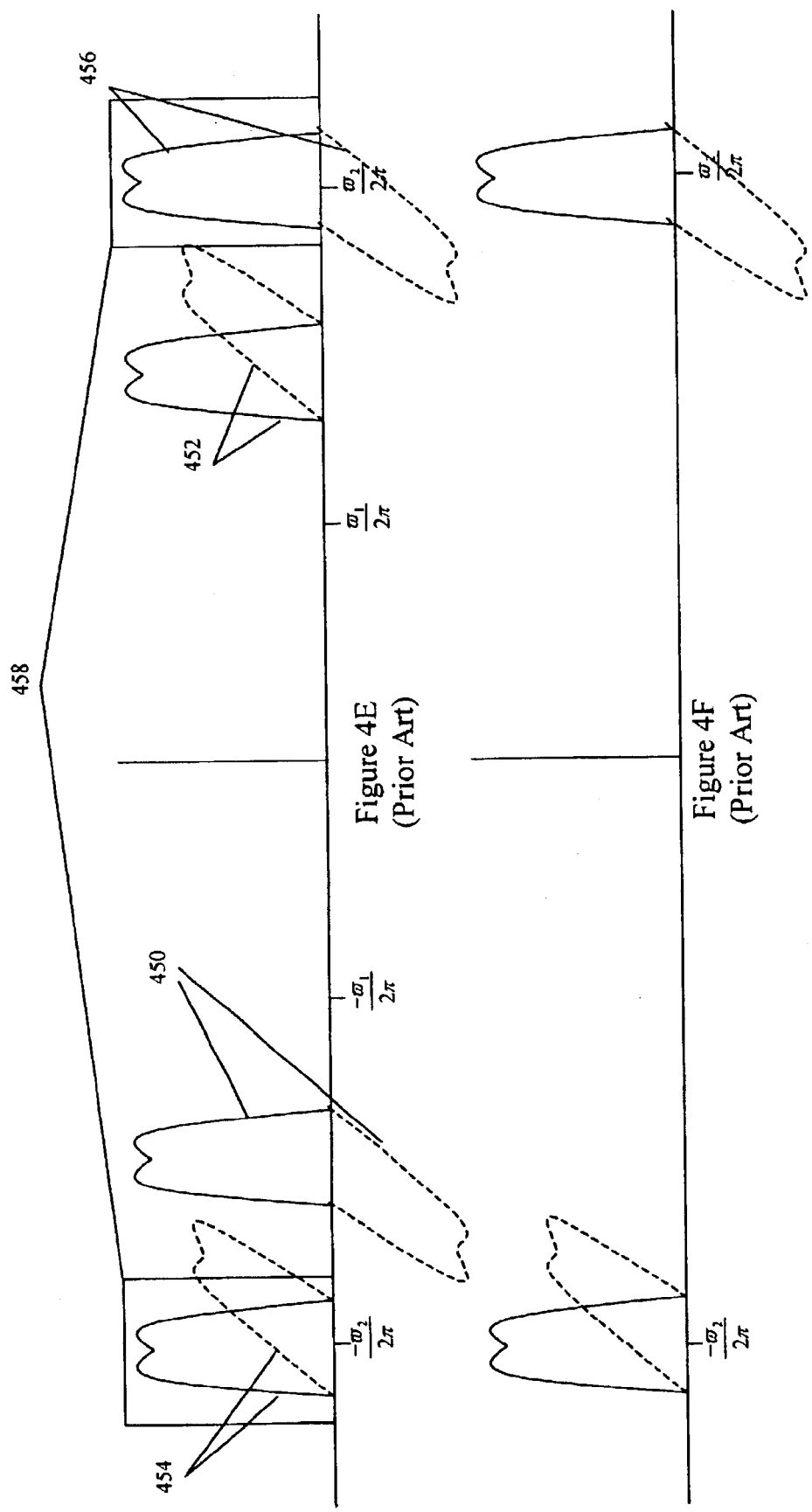

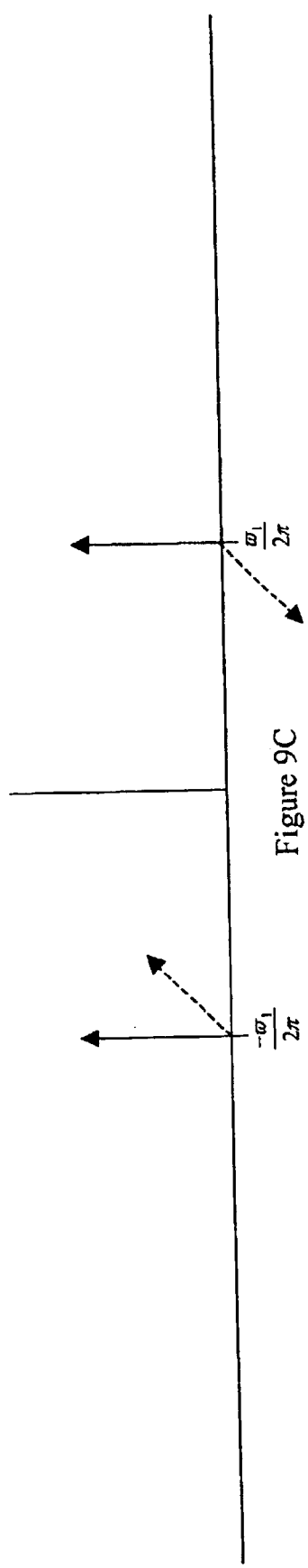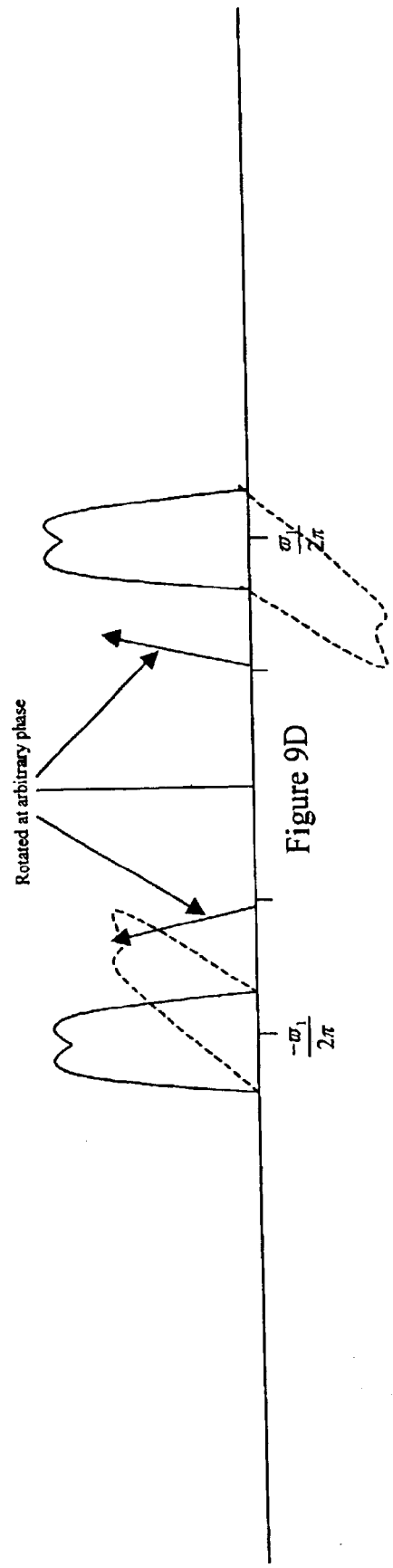

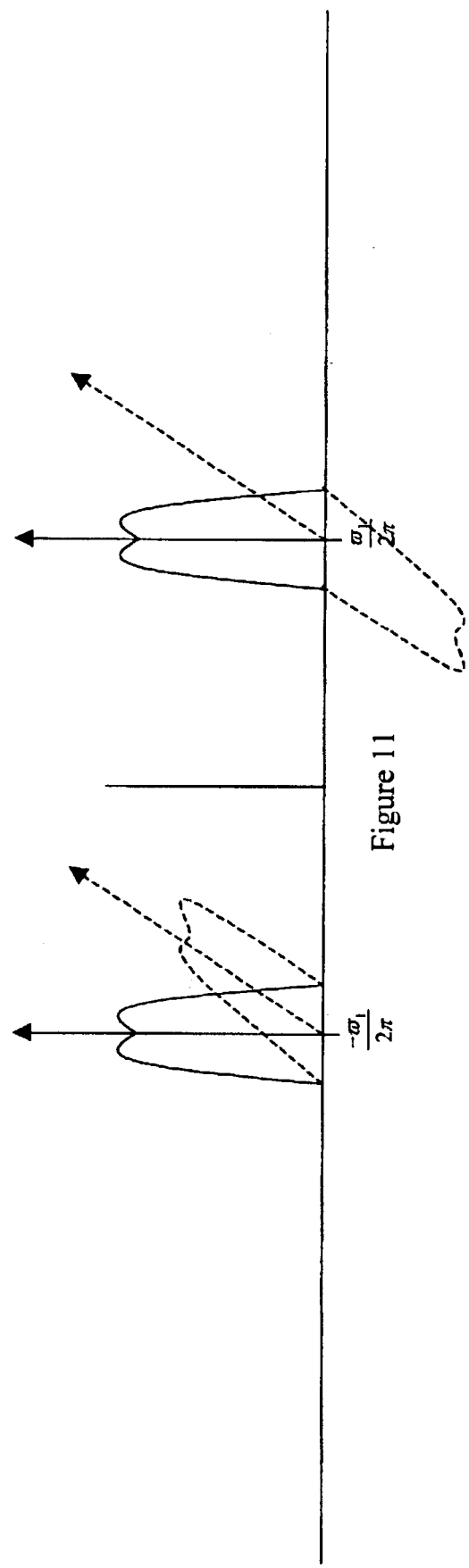

METHOD AND APPARATUS FOR RE-MODULATION USING ZERO IF

REFERENCE TO EARLIER APPLICATION

This application claims the benefit of, and incorporates by reference, U.S. Provisional Application No. 60/410,567 filed Sep. 13, 2002.

FIELD OF THE INVENTION

The present invention relates to the field of communications systems. More particularly, the present invention relates to electronic circuitry for use in modulating and demodulating digital communication signals.

BACKGROUND OF THE INVENTION

Modulation techniques find wide application in communications systems. In fact, modulation techniques are used to facilitate the transmission of communications signals over many mediums including wired and wireless systems. For example, modulation techniques are used to transmit communications signals over wired systems such as coaxial or twisted pair. Also, modulation techniques are used to transmit communications signals over the air such as in microwave or satellite communications. In practical applications, it may also be the case that several modulations are necessary to achieve a final result. For example, several modulations may be necessary to transmit a communications signal from customer premise equipment (CPE) to a local office and then to transmit it via microwave systems over long distances.

In achieving microwave communications it is often necessary to modulate a signal for transmission over a cable and then re-modulate it for transmission over the air. Toward optimizing modulation for cable transmission a relatively low modulation frequency is typically used. But, to optimize modulation for over-the-air transmission, relatively high microwave frequencies are preferred. Thus, the relatively low frequency modulation must be re-modulated to a high microwave frequency. Microwave transmitters, however, typically have narrow range tuners such that several re-modulations may be necessary.

Prior attempts have been made to solve the problem of translating a modulated signal from a relatively low modulation frequency to a relatively high modulation frequency by using a heterodyne technique. In this technique, a first modulation at a relatively low frequency is implemented for transmitting a communications signal over a cable. At the other end of the cable, the signal at the relatively low modulation frequency is then re-modulated to a relatively high frequency. Here, the first modulation frequency needs to be low enough in frequency so that the interconnecting cable loss is minimized. Among other things, this heterodyne approach requires carefully designed image rejection filters to achieve adequate frequency translation. For good image rejection, the first modulation frequency must be as high as possible to make the image rejection filter easier to build which is in conflict with the need to keep the first modulation frequency as low as possible. The presence of the image rejection filter greatly reduces the ability to tune the second modulator to an arbitrary frequency. This technique, developed many years ago, is still quite common in many radio products from a variety of manufacturers.

A second technique, however, places the modulation source at the end of the cable near the microwave transmitter and uses direct conversion to modulate to a relatively high frequency suitable for application to a microwave transmission. Direct conversion by its nature allows for a wide tuning variation. Data, however, must be transmitted through the cable so that it can be modulated at the other end of the cable. To do this requires additional hardware to detect the data and correct for signal transmission impairments induced by the cable as well as to recover data and the timing information associated with it. This direct modulation approach suffers from the fact that data and clock need to be applied to a modulator at the cable end. Therefore, a modulator is required to drive the cable and a demodulator is required at the cable end to receive the data and regenerate the timing information associated with that data.

Accordingly, there is a need to improve modulated signal communication methods and systems. The present invention addresses the foregoing and related issues.

SUMMARY OF THE INVENTION

The present invention solves many of the problems of the prior art by providing for a first modulation at an arbitrary frequency and a second modulation at another arbitrary frequency. To achieve this, the present invention demodulates the first modulation using the same reference oscillator signal that was used in the first modulation. Because modulation and demodulation are achieved using the same reference oscillator signal, a close approximation of the original signals is achieved. With this close approximation, a subsequent re-modulation can be readily achieved at a second arbitrary frequency and can further be achieved using low-cost synthesizer and modulation components. In effect, a first modulation is achieved at a first frequency; the first modulation is then demodulated to zero frequency; and, in turn, a second modulation (i.e., re-modulation) is achieved at a second frequency.

In an embodiment of the invention, a reference oscillator signal is used to generate a first modulation frequency. The first modulation frequency is then used to generate a first modulated signal. The reference oscillator signal and the modulated signal are then transmitted over the same medium to a destination. At the destination, the reference oscillator signal is used to demodulate the modulated signal to, in effect, generate approximations of the baseband signals. Thus, a zero frequency demodulation is achieved. Thereafter a second modulation is implemented at an arbitrary frequency.

In another embodiment of the invention, a first modulation frequency signal and the modulated signal are transmitted over the same medium to a destination. At the destination, the first modulation frequency signal is used to demodulate the modulated signal to, in effect, generate approximations of the baseband signals. Thus, a zero frequency demodulation is achieved. Thereafter, a second modulation is implemented at an arbitrary frequency.

BRIEF DESCRIPTION OF THE DRAWINGS

The accompanying drawings, which are incorporated in and form a part of this specification, illustrate embodiments of the invention and, together with the description, serve to explain the principles of the invention.

FIGS. 2A–2D are frequency domain representations of various modulated signals according to the prior art.

FIGS. 4A–4F are frequency domain representations of various signals present in heterodyne modulation according to the prior art.

FIGS. 9A–9F are frequency domain representations of various signals present in zero IF re-modulation according to the present invention.

FIG. 11 is a frequency domain representation of various signals present in zero IF re-modulation according to the present invention.

DETAILED DESCRIPTION OF THE PREFERRED EMBODIMENTS

The present invention solves many of the problems of traditional approaches. In particular, the present invention provides for frequency translation of a modulated signal from an first IF to a second IF frequency without the need for image rejection filtering. Because the first and second IF frequencies can be arbitrary and no image rejection filtering is required, a wide tuning variability of the second IF can be realized which, in turn, simplifies a third conversion to microwave RF.

Figure 1A:
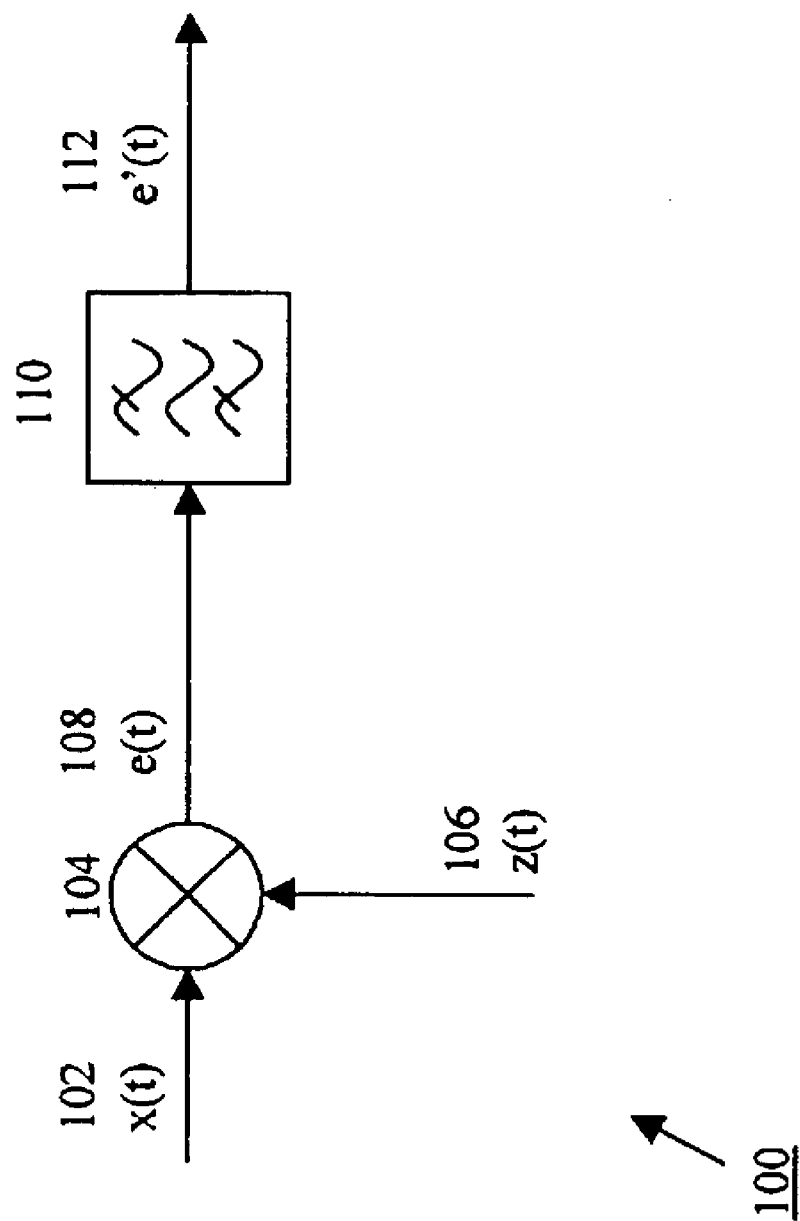
FIG. 1A is a block diagram of a system for modulating a signal according to the prior art.

In order to understand the present invention, however, it is first useful to first understand some tuning and modulation concepts. As is well known, multiplying a lowpass signal by a high-frequency periodic signal translates the spectrum of the lowpass signal to all frequencies present in the periodic signal. Quite often it is desirable to translate a bandpass signal to a new center frequency. This process can be accomplished by multiplication of the bandpass signal by a periodic signal and is often called mixing or converting. FIG. 1A is a block diagram illustrating the mixing or converting of a bandpass signal by a periodic signal. As shown, a modulated signal, $x(t)=f(t)\cos(\omega_1 t)$, is provided at input 102. The function, $f(t)$, has Fourier transform, $F(s)$, as shown in FIG. 2A such that the bandpass signal, $x(t)$, has Fourier transform, $X(s)$, as shown in FIG. 2B. Moreover, using known characteristics of the Fourier transform, the Fourier transform, $X(s)$, of the bandpass signal, $x(t)$, can be written as $$X(s) = F(s) * \Im(\cos(\overline{\omega}_1 t))$$

Note that * represents convolution and $\Im(\bullet)$ denotes the Fourier transform of the argument. Recall that $$\Im(\cos(\pi t)) = \Pi(s) = \frac{1}{2}\delta\left(s + \frac{1}{2}\right) + \frac{1}{2}\delta\left(s - \frac{1}{2}\right).$$

which can be manipulated using the similarity theorem:

$$f(at) \Rightarrow \frac{1}{|a|}F\left(\frac{s}{a}\right).$$

where $\alpha$ is a scaling factor. We therefore have $$\Im(\cos(\overline{\omega}_1 t)) = \Im\left(\cos\left(\frac{\overline{\omega}_1}{\pi}(\pi t)\right)\right)$$

$$\Im(\cos(\overline{\omega}_1 t)) = \Pi\left(\frac{\overline{\omega}_1}{\pi}s\right) = \frac{1}{\frac{\overline{\omega}_1}{\pi}}\left(\frac{1}{2}\delta\left(\frac{s}{\frac{\overline{\omega}_1}{\pi}} + \frac{1}{2}\right) + \frac{1}{2}\delta\left(\frac{s}{\frac{\overline{\omega}_1}{\pi}} - \frac{1}{2}\right)\right)$$

$$\Im(\cos(\overline{\omega}_1 t)) = \frac{\pi}{\overline{\omega}_1}\left(\frac{1}{2}\delta\left(\frac{\pi}{\overline{\omega}_1}s + \frac{1}{2}\right) + \frac{1}{2}\delta\left(\frac{\pi}{\overline{\omega}_1}s - \frac{1}{2}\right)\right).$$

Here, recall a property of the delta function:

$$\delta(as) = \frac{1}{|a|}\delta(s)$$

where $\alpha$ is again a scaling factor. We now have $$\Im(\cos(\overline{\omega}_1 t)) = \frac{\pi}{\overline{\omega}_1}\left(\frac{1}{2}\delta\left(\frac{\pi}{\overline{\omega}_1}\left(s + \frac{\overline{\omega}_1}{2\pi}\right)\right) + \frac{1}{2}\delta\left(\frac{\pi}{\overline{\omega}_1}\left(s - \frac{\overline{\omega}_1}{2\pi}\right)\right)\right)$$

$$\Im(\cos(\overline{\omega}_1 t)) = \frac{\pi}{\overline{\omega}_1}\frac{\overline{\omega}_1}{\pi}\left(\frac{1}{2}\delta\left(s + \frac{\overline{\omega}_1}{2\pi}\right) + \frac{1}{2}\delta\left(s - \frac{\overline{\omega}_1}{2\pi}\right)\right)$$

$$\Im(\cos(\overline{\omega}_1 t)) = \frac{1}{2}\delta\left(s + \frac{\overline{\omega}_1}{2\pi}\right) + \frac{1}{2}\delta\left(s - \frac{\overline{\omega}_1}{2\pi}\right)$$

as shown in FIG. 2B with signals 204 and 208. $X(s)$ can be determined with $$X(s) = F(s) * \Im(\cos(\overline{\omega}_1 t))$$

$$X(s) = F(s) * \left(\frac{1}{2}\delta\left(s + \frac{\omega_1}{2\pi}\right) + \frac{1}{2}\delta\left(s - \frac{\omega_1}{2\pi}\right)\right)$$

which after applying some properties of the delta function becomes $$X(s) = \frac{1}{2}F\left(s + \frac{\omega_1}{2\pi}\right) + \frac{1}{2}F\left(s - \frac{\omega_1}{2\pi}\right).$$

Indeed, as shown in FIG. 2B where the signal $F(s)$ is shifted by the frequency $\omega_1/2\pi$ and scaled by ½ as shown in FIG. 2B with signals 206 and 210.

As further shown in FIG. 1A, a periodic signal, $z(t)=2\cos(\omega_1+\omega_2)t$, is provided at input 106 to mixer 104. Note that the frequency, $\omega_2$, is a shifting frequency that for the purposes of the present discussion can be a negative value; further note that the amplitude, 2, is chosen for convenience in scaling as will become evident. The Fourier transform, $Z(s)$, of the periodic signal, $z(t)$, is written as $$Z(s) = \Im(2\cos((\overline{\omega}_1+\overline{\omega}_2)t)) = 2\Im(\cos((\overline{\omega}_1+\overline{\omega}_2)t))$$

$$Z(s) = 2\Im\left(\cos\left(\left(\frac{\varpi_1 + \varpi_2}{\pi}\right)\pi t\right)\right)$$

$$Z(s) = 2\frac{1}{\left|\frac{\varpi_1 + \varpi_2}{\pi}\right|}\Pi\left(\frac{s}{\frac{\varpi_1 + \varpi_2}{\pi}}\right)$$

$$Z(s) = \frac{2\pi}{\varpi_1 + \varpi_2}\Pi\left(\frac{\pi}{\varpi_1 + \varpi_2}s\right)$$

$$Z(s) = \frac{2\pi}{\omega_1 + \omega_2}\left[\frac{1}{2}\left(\delta\left(\frac{\pi}{\omega_1 + \omega_2}s + \frac{1}{2}\right) + \delta\left(\frac{\pi}{\omega_1 + \omega_2}s - \frac{1}{2}\right)\right)\right]$$

which can be rewritten as $$Z(s) = \delta\left(s + \frac{\omega_1 + \omega_2}{2\pi}\right) + \delta\left(s - \frac{\omega_1 + \omega_2}{2\pi}\right).$$

Note that here, the chosen amplitude, 2, eliminates carrying forward a scaling factor of ½. The Fourier transform of Z(s) is shown as the δ functions 220 and 222 in FIG. 2C.

As both the bandpass signal, x(t), and the periodic signal, z(t), are provided to the inputs of mixer 104, the resulting signal, e(t), at output 108 is the product, e(t)=x(t)z(t) whose Fourier transform is the convolution, E(s)=X(s)*Z(s). From the above results for X(s) and Z(s) and after some mathematical manipulation, we have:

$$E(s) = X(s) * \left[\delta\left(s + \frac{\omega_1 + \omega_2}{2\pi}\right) + \delta\left(s - \frac{\omega_1 + \omega_2}{2\pi}\right)\right]$$

$$E(s) = X\left(s + \frac{\omega_1 + \omega_2}{2\pi}\right) + X\left(s - \frac{\omega_1 + \omega_2}{2\pi}\right)$$

$$E(s) = \left[\frac{1}{2}F\left(s + \frac{2\omega_1 + \omega_2}{2\pi}\right) + \frac{1}{2}F\left(s - \frac{2\omega_1 + \omega_2}{2\pi}\right)\right] + \left[\frac{1}{2}F\left(s + \frac{\omega_2}{2\pi}\right) + \frac{1}{2}F\left(s - \frac{\omega_2}{2\pi}\right)\right].$$

With regard to the first bracketed term in the above equation, the term $$\frac{1}{2}F\left(s + \frac{2\omega_1 + \omega_2}{2\pi}\right)$$

is shown as signal 224 in FIG. 2C; the term $$\frac{1}{2}F\left(s - \frac{2\omega_1 + \omega_2}{2\pi}\right)$$

is shown as signal 230; the term $$\frac{1}{2}F\left(s + \frac{\omega_2}{2\pi}\right)$$

as signal 226; and the term $$\frac{1}{2}F\left(s - \frac{\omega_2}{2\pi}\right)$$

as signal 228. In the time domain, we have the inverse Fourier transform, e(t), as $$e(t)=f(t)\cos((2\omega_1+\omega_2)t)+f(t)\cos(\omega_2 t)$$

Note that the first term, f(t) cos((2ω₁+ω)₂t), is undesired and is therefore filtered out using filter 110 (FIG. 1A). Bandpass filter response 232 is shown in FIG. 2C. The output 112 of bandpass filter 110 is therefore $$e'(t)=f(t)\cos(\omega_2 t).$$

The filtered output signal, e'(t), is a shifted version of the input signal, x(t). In the frequency domain, this result is shown in FIG. 2D.

Mixer 104 of FIG. 1A can be used as part of a tuner including single-conversion and dual-conversion tuners. More recently, dual conversion tuners find wide application in telecommunications. In a dual conversion tuner, as the name implies, two conversions (i.e., two mixers) are implemented. Moreover, in a dual conversion tuner, the input frequency, 2ω₁+ω₂, to bandpass filter 110 is referred to as an image frequency of the desired frequency, ω₂. The image frequency can sometimes be a problem and therefore needs to be filtered in such tuner applications.

Figure 1B:
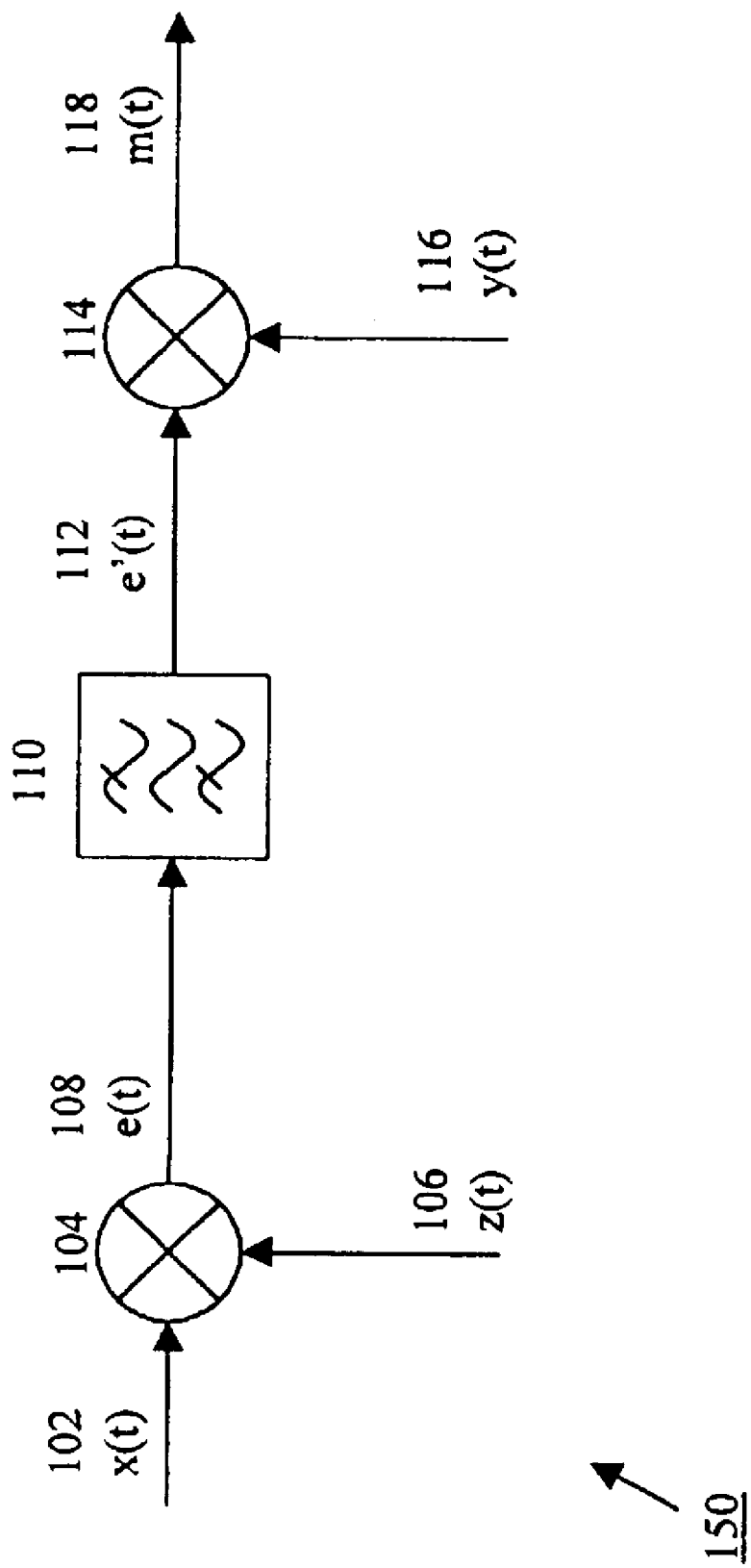
FIG. 1B is a block diagram of a system for modulating a signal according to the prior art.

In a dual-conversion tuner 150; as shown in FIG. 1B, a first mixer 104 (note that like-numbered components between FIG. 1A and FIG. 1B operate similarly) up-converts a signal, x(t), received at input 102 to a signal, e(t), at mixer output 108 having a first intermediate frequency (IF) higher than the frequency of x(t). The first IF signal, e(t), is then filtered by filter 110. The filtered signal, e'(t), is then at a nominal amplitude while all the rejected signals are at a much lower amplitude. The filtered signal, e'(t), is then input to a second mixer 114 where mixer 114 mixes signal y(t) at input 116 to up-convert the filtered signal, e'(t), into a desired IF signal, m(t), at output 118. The desired IF signal, m(t), is thus the frequency a user desires. In actual implementation, amplification of signals and other factors need to be considered as will be discussed below.

Figure 3:
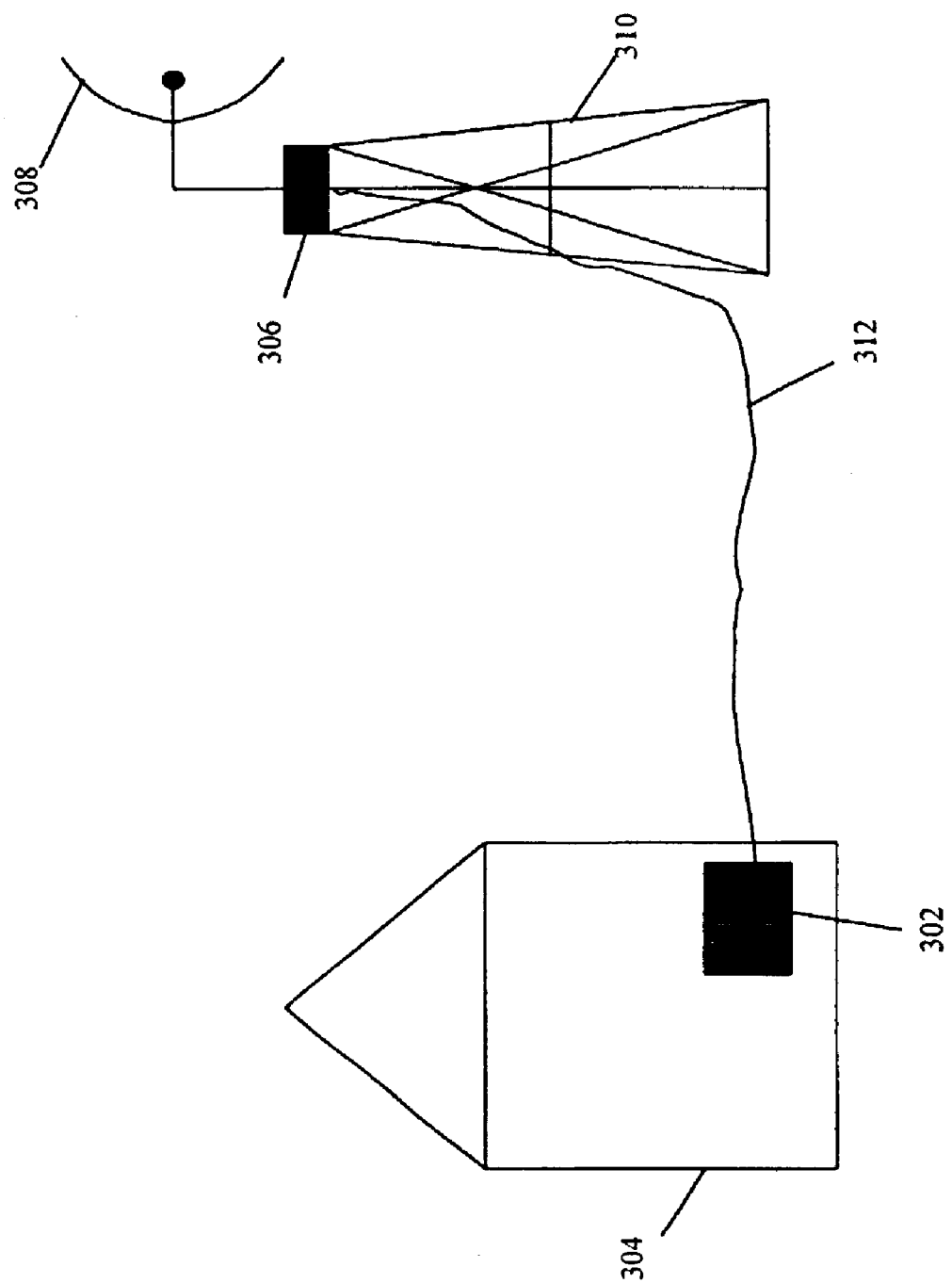
FIG. 3 is a drawing depicting an indoor unit (IDU) and an outdoor unit (ODU) as used in microwave communications.

With this understanding of mixing and modulation, the problem of translating a modulated signal from a low IF frequency to a high IF frequency by using a heterodyne technique can be better understood. This problem arises in telecommunications and, in particular, microwave communications. One approach in microwave communications involves a source connected to a distant microwave transmitter through a coaxial cable. For example as shown, in FIG. 3, indoor unit (IDU) 302 is contained within building 304. IDU 302 is configured to generate desired communications information. Such information needs to be delivered to an outdoor unit (ODU) 306 that is often located near an antenna 308 in an elevated position such as on tower 310 away from IDU 302. In order to deliver communications information from IDU 302 to ODU 306, interconnecting cable 312 is often used. To do this, the desired communications information is usually modulated at a first intermediate frequency (IF) using techniques as described above. Importantly, the IF frequency needs to be low enough in frequency so that the interconnecting cable loss is minimized. In turn, the desired communications information is modulated at an RF frequency appropriate for transmission over the air also using techniques as described above. Note that two modulations are required to achieve the end result of transmission over the air. This technique is quite common in many radio products from a variety of manufacturers.

Figure 4A:
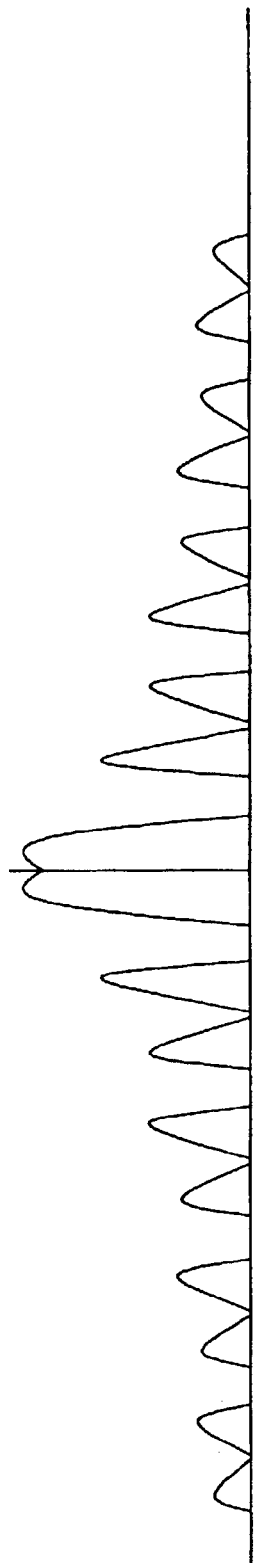
Figure 4B:
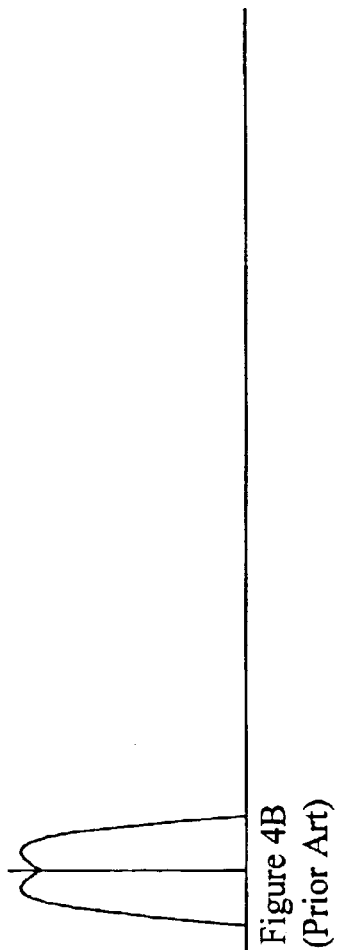
Figure 5:
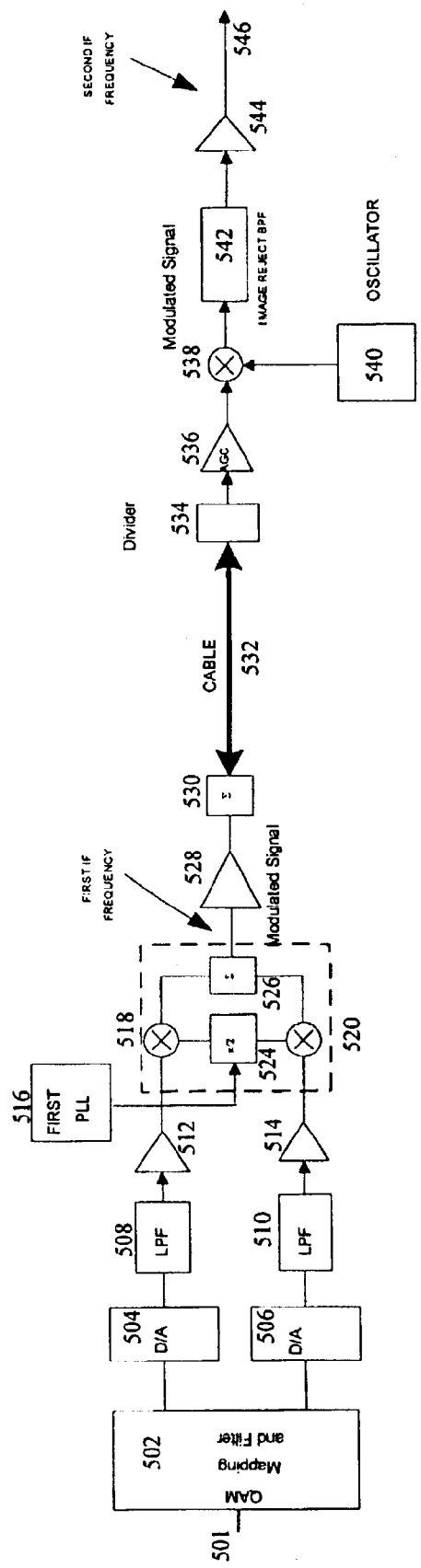
FIG. 5 is a block diagram of a system for implementing heterodyne modulation according to the prior art.

Previously, a standard heterodyne architecture has been used such as shown in FIG. 5. As shown in FIG. 5, desired digital communications information is provided at input 501. Such information is then mapped and filtered to produce an in-phase and quadrature signals according to quadrature amplitude modulation (QAM) as shown at block 502. Thereafter, digital-to-analog converters 504 and 506 convert the QAM information into an appropriate baseband signal with frequency content as shown in FIG. 4A. Low pass filters 508 (FIG. 5) and 510 then filter undesired signals to produce a filtered output as shown in FIG. 4B. The filtered signals are scaled as needed using amplifiers 512 and 514 which produce a scaled version of the signal of FIG. 4B. Using techniques as described above, the baseband signal is then modulated using a periodic signal having a first frequency. The periodic signal is generated at synthesizer or oscillator 516. Ninety-degree phase shifting is provided at phase shifter 524. Phase shifter 524 then provides phase shifted signals at the first frequency as shown in FIG. 4C where the in-phase periodic signal is represented as a real component and the phase shifted periodic signal is represented as an imaginary component. Note that real and imaginary spectral content are represented in solid and dashed lines, respectively. The scaled and filtered baseband signals are mixed with the periodic signals at mixers 518 and 520 to generate the modulated in-phase and quadrature signals with spectral content as shown in FIG. 4D. At this point the information is said to be modulated at a first intermediate frequency (IF). The modulated signals are then summed at summer 526 to generate the composite signal which is then amplified as necessary at amplifier 528 and directed to another summer 530 and then transmitted on cable 532. Note that summer 530 is provided in order to assemble or accumulate multiple modulated signals, however, only one is shown in FIG. 5. Indeed, such a device can be implemented in many ways such as through a summer as shown or a N-plexer as will be described in another embodiment. Moreover, many other types of assemblers, appropriate for use in the present invention, may be developed in the future.

At a destination, such as at an ODU, a divider 534 receives the signals carried on cable 532. For similar reasons as summer 530, divider 534 is provided to handle multiple modulated signals. Divider 534, as is the case for summer 530, can be implemented in many ways. For example, divider 534 can be implemented using filters or a similar N-plexer as used for summer 530. Divider 534 provides the appropriate modulated signal (here we have only one) to automatic gain control using (AGC) 536 which amplifies the signal as necessary. Thus, after AGC 536, the signal is a scaled version of the modulated signal. As mentioned before, for microwave transmission, it is necessary to modulate such signal using an RF modulator with at a different frequency. Thus, a second modulation is implemented. Oscillator 540 generates a periodic signal at a second frequency; such signal is then provided to mixer 538. In a result similar to that described previously, the output of mixer 538 is a second modulated signal with undesired spectral content. The spectral content of this result is shown in FIG. 4E where signals 454 and 456 are desired and signals 450 and 452 are undesired. As shown in FIG. 5, bandpass filter 542 (with filter response 458 as shown in FIG. 4E) is therefore provided to eliminate the undesired signals and produce the desired and scaled, through the use of amplifier 544, output signal with spectral content as shown in FIG. 4F. At this point, the communications information is said to be modulated at a second IF.

In practical applications, the second modulation at the ODU presents various problems. In order to achieve a wide tuning range, the ODU requires careful attention to image filtering conducted by bandpass filter 542. In fact, in consideration of image filtering, tuning range can become such a problem at certain frequencies that several stages of conversion and tuning become necessary. For example, the tuning range of certain oscillators such as oscillator 540 could be as high as 600 MHz, for example, such that any simple conversion to microwave frequencies would put an undesired image frequency within a frequency band of interest unless additional switchable filtering was present. These problems make the ODU more complicated and more costly because the first IF signal over the cable can be much less than the tuning range (in this example 600 MHz) so as to keep cable loss to a minimum. Illustratively, consider the situation where the first IF is 100 MHz and the tuning range of the second IF is 600 MHz centered around 2 GHz. In this situation, the image will be well within the tuning band requiring multiple image rejection filters with extremely sharp rejection characteristics. Indeed, many filters would have to be switched in and out in order to provide full tuning.

Figure 6:
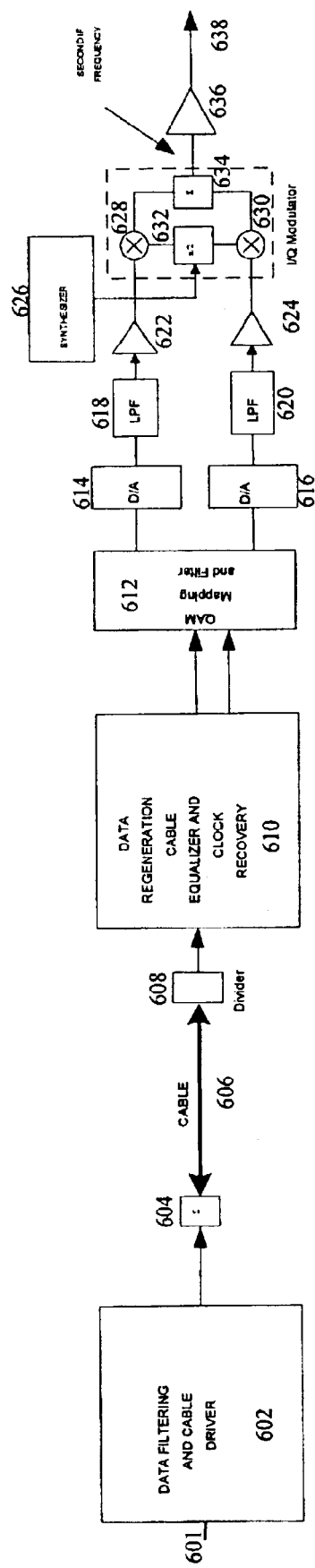
FIG. 6 is a block diagram of a system for implementing direct modulation according to the prior art.
Figure 7A:
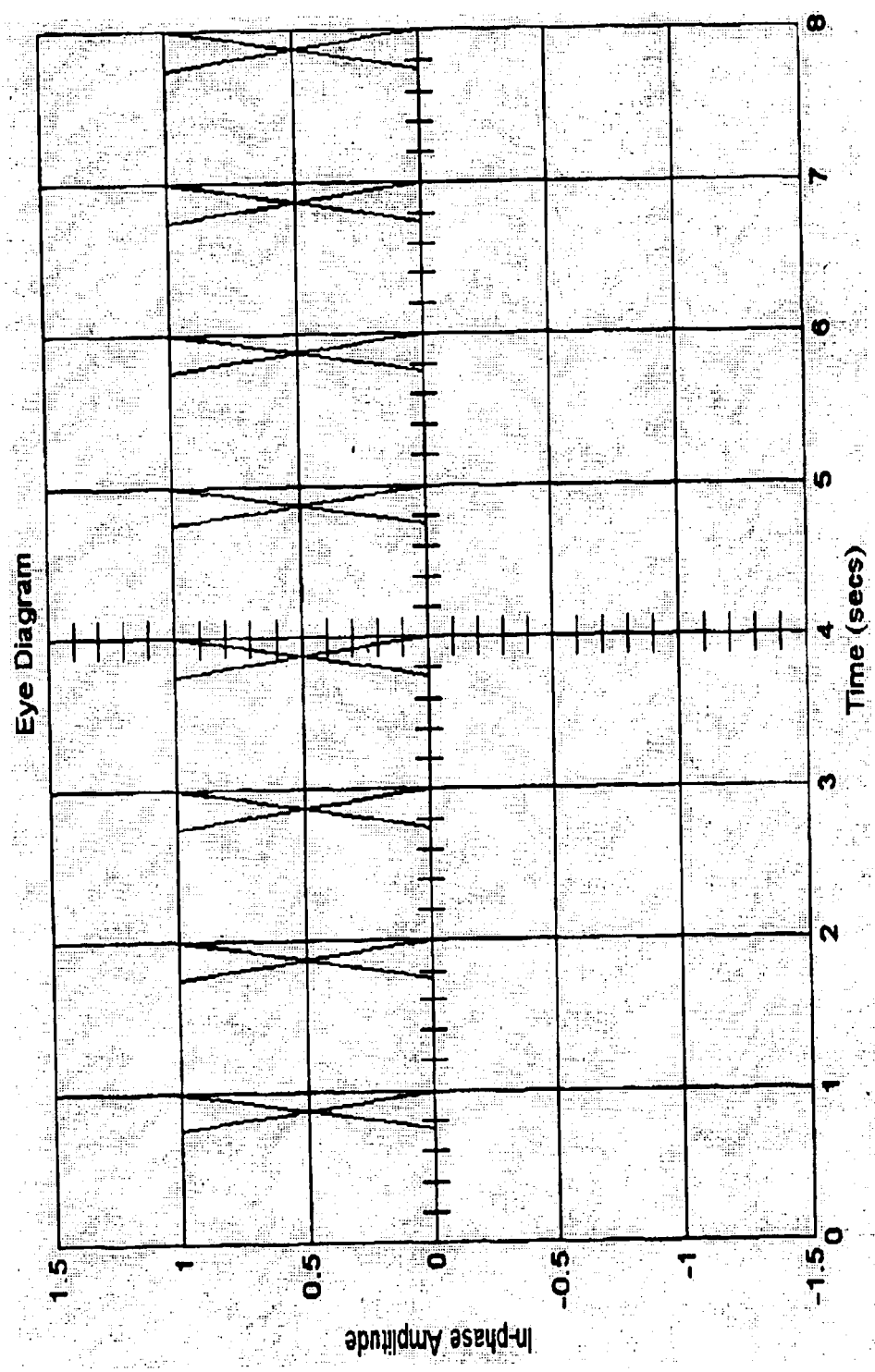
FIGS. 7A and 7B are signal representations as seen in direct modulation according to the prior art.
Figure 7B:
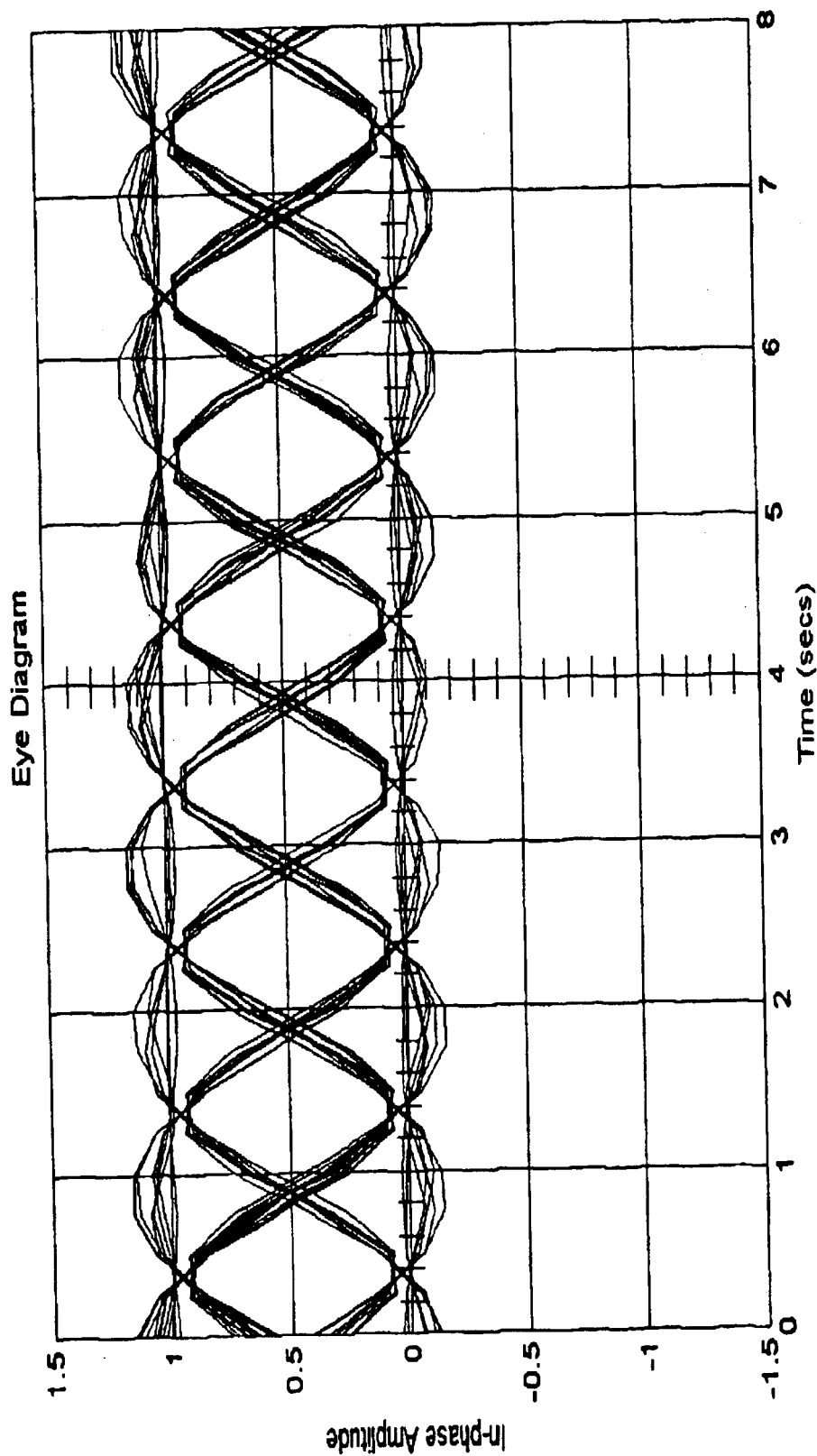

Another previously known technique places modulation sources at the end of the cable in the ODU near the microwave transceiver. This technique uses direct conversion to modulate communications information to a high modulation frequency suitable for application in a microwave transceiver. As shown in FIG. 6, digital communications information is provided at input 601 to block 602 where such information is filtered and amplified. Block 602 is typically performed at an IDU. Thereafter, the information is passed through a summer 604 in order to accommodate other digital communications inputs. Thereafter, the baseband digital information is directed to cable 606 for transmission to an ODU. At the ODU, the transmitted signal is received by divider 608 to separate out various streams of information that may have been transmitted over cable 606. Here, for clarity of discussion, only one stream of data is being described. Upon dividing out the appropriate steam of information, the transmitted signal is processed at block 610. Among other things, block 610 provides cable equalization and clock recovery. The problems of direct modulation can be understood with reference to an "eye diagram used in digital communications to visualize how waveforms used to send multiple bits of data can potentially lead to errors in the interpretation of those bits. Shown in FIG. 7A is a representation of a modulated signal at the input of cable 606. Shown in FIG. 7B is a representation of the modulated signal received at the other end of cable 606. Notably, the eye diagram of FIG. 7B illustrates the dispersion that can lead to inter-symbol interference as the received signal is distorted. The processing at block 610 recovers a clocking signal associated with the received signal and further corrects for its distortion. The output of block 610 is therefore an approximation of the signal provided at input 601. Moreover, the output of 610 is provided to a modulation circuit substantially similar to those discussed above. Here, the modulation circuit is made up of components 612–636 that are used to modulate at a frequency appropriate for direct input to a microwave RF transceiver. Synthesizer 626 generates the appropriate periodic signal for input to the RF transceiver.

Synthesizer 626 typically has a broader tuning range than does oscillator 540 of FIG. 5 such that the scheme of FIG. 6 allows for more agile tuning. In fact, direct conversion by its nature allows for a wide tuning variation in the IF frequency. Data, however, must be transmitted through the cable and applied to a cable driver contained within block 602. In doing this, additional hardware such as contained in block 610 is needed to detect the transmitted data and to correct for cable transmission impairments, to recover the transmitted data, and to recover timing information associated with the data. The scheme of FIG. 6 is further complicated when various signals are carried on the cable 606. For example, the data rates must be chosen so that the transmitted data signals do not interfere with each other.

With regard to implementation of the foregoing approaches, the heterodyne approach requires carefully designed image rejection filters to implement a successful frequency translation. This requires that the first IF be as high as possible in order to make the image rejection filter easier to build. But this is in direct conflict with the need to keep the first IF frequency as low as possible to reduce the effects of cable loss. Indeed, the presence of the image reject filter greatly reduces the ability to tune the second IF to whatever frequency is desired. The direct modulation also has its disadvantages. It suffers from the fact that data and clock need to be applied to the cable driver such that another modulator of some form is required to drive the cable and a companion demodulator is required at the other end of the cable in order to receive the data and regenerate the timing information associated it.

The present invention solves many of the problems of such traditional approaches. In particular, the present invention provides for frequency translation of a modulated signal from an first IF to a second IF frequency without the need for image rejection filtering. Because the first and second IF frequencies can be arbitrary and no image rejection filtering is required, a wide tuning variability of the second IF can be realized which, in turn, simplifies a third conversion to microwave RF.

In an application of the present invention to be described, a quadrature-modulated signal at a first low IF is transmitted over a length of cable. Importantly, the low IF provides for low cable loss. Upon receiving the transmitted signal at another end of the cable, the received signal is translated to a much higher IF that can be applied to a microwave transceiver. The achieved wide tuning range without narrow image filtering requirements makes tuning the final microwave frequency easier with less expensive hardware.

Figure 8:
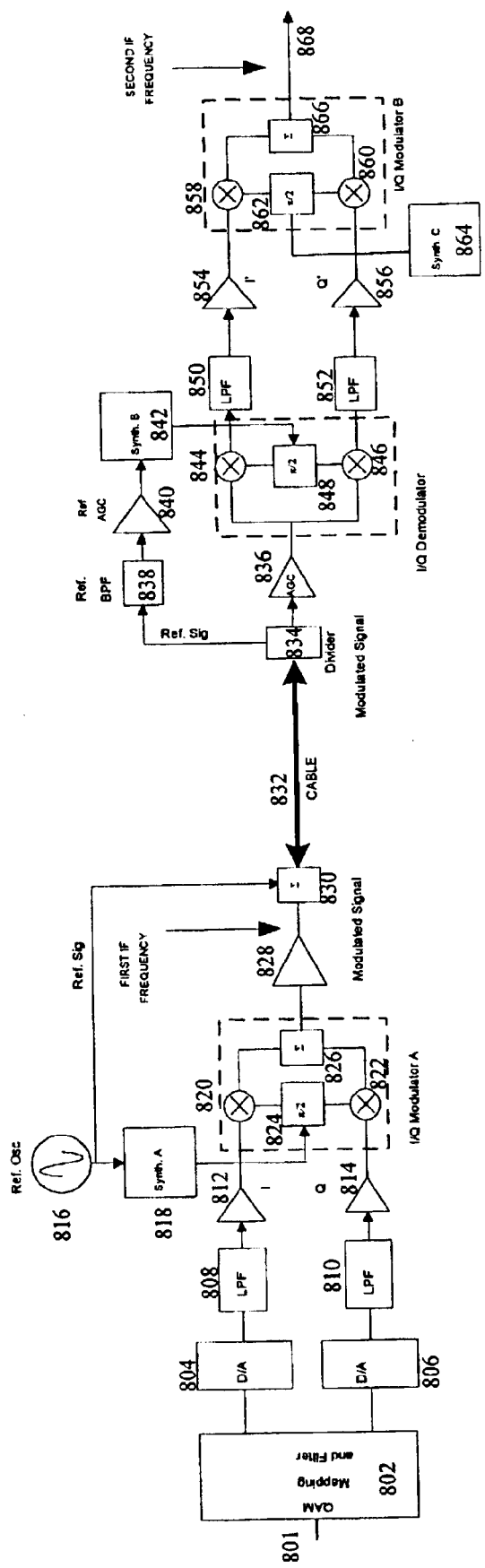
FIG. 8 is a block diagram of a preferred embodiment of a system for implementing zero IF re-modulation according to the present invention.
Figure 9A:
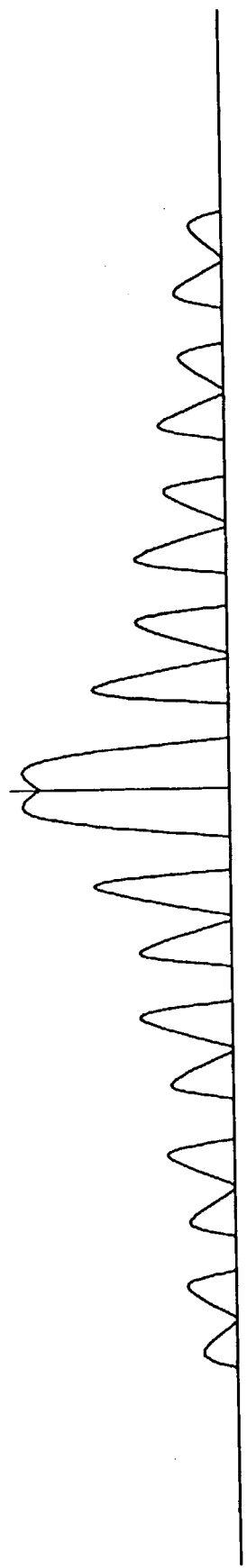
Figure 9B:
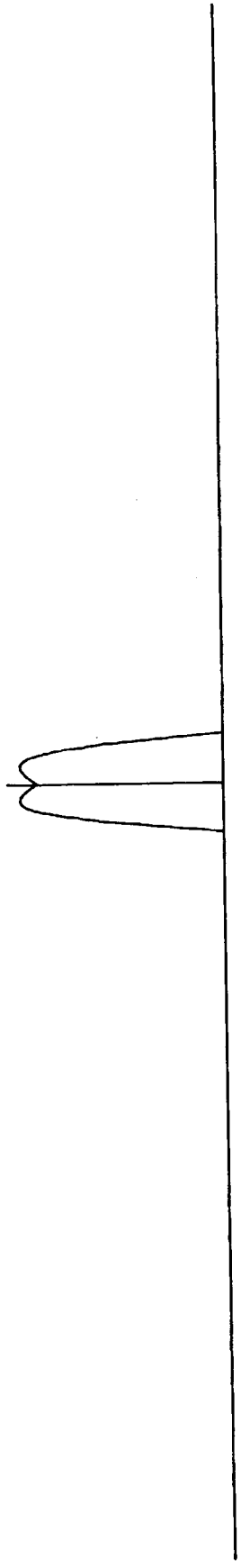

According to a preferred embodiment of the present invention as shown in FIG. 8, digital data is provided at input 801 to block 802 where it is mapped and filtered for subsequent quadrature amplitude modulation (QAM) to produce in-phase and quadrature signals according to the QAM format which is as shown at block 502. Thereafter, digital-to-analog converters 804 and 806 convert the QAM information into an appropriate baseband signal with frequency content as shown in FIG. 9A. Low pass filters 808 and 810 then filter undesired signals to produce a filtered output as shown in FIG. 9B. The filtered signals are scaled as needed using amplifiers 812 and 814 which produce a scaled version of the signal of FIG. 9B. Using techniques as described above, the baseband signal is then modulated using a periodic signal at a first IF frequency. The periodic signal is generated by means of reference oscillator 816 coupled to synthesizer 818. Synthesizer 818 then generates the periodic signal at a desired first low IF. The periodic signal is directed to quadrature phase shifter 824 for appropriate phase shifting. Phase shifter 824 then provides phase shifted periodic signals at a first frequency as shown in FIG. 9C. The scaled and filtered input signals are then mixed with the periodic signals at mixers 820 and 822 to generate the modulated in-phase and quadrature signals with spectral content as shown in FIG. 9D. At this point the information is said to be modulated at a first IF. The modulated signals are then summed at summer 826 to generate the composite quadrature modulated signal which is then amplified as necessary at amplifier 828 and directed to another summer 830.

In contrast to the prior art heterodyne approach, the present invention further provides the signal from the reference oscillator 816 to summer 830. Accordingly, the modulated data signal at a first IF and the reference oscillator signal are both transmitted over cable 832. The spectral content of the signals transmitted over cable 832 are as shown in FIG. 9D. Note that summer 830 is provided in order to accumulate various modulated signals and various reference oscillator signals, however, only one is shown in FIG. 8. At a destination, such as at ODU 306 (FIG. 3), a signal divider 834 receives the modulated and reference oscillator signals carried on cable 832. For similar reasons, signal divider 834 and summer 830 are provided to handle various modulated and reference signals. Signal divider 834 provides the appropriate modulated signal (here we have only one) to AGC 836 which amplifies the signal as necessary. Also, and in contrast to the prior art heterodyne approach, the divider separates out the reference oscillator signal and provides it to reference bandpass filter 838 to clean up the reference oscillator signal. Moreover, amplification is provided by AGC 840. This processed reference oscillator signal is then provided to synthesizer 842 in much the same manner as reference oscillator 816 signal was provided to synthesizer 818. Through the use of synthesizer 842 in conjunction with components 844 through 856, the received modulated signal is demodulated to baseband in-phase and quadrature signals. Indeed, this demodulation is simply another modulation; the demodulation is achieved by a second modulation using a periodic signal at the same frequency. Because synthesizer 842 receives the reference oscillator signal at the same frequency as synthesizer 818, it can similarly produce the same output frequency which is used to demodulate an already modulated signal.

Figure 9E:
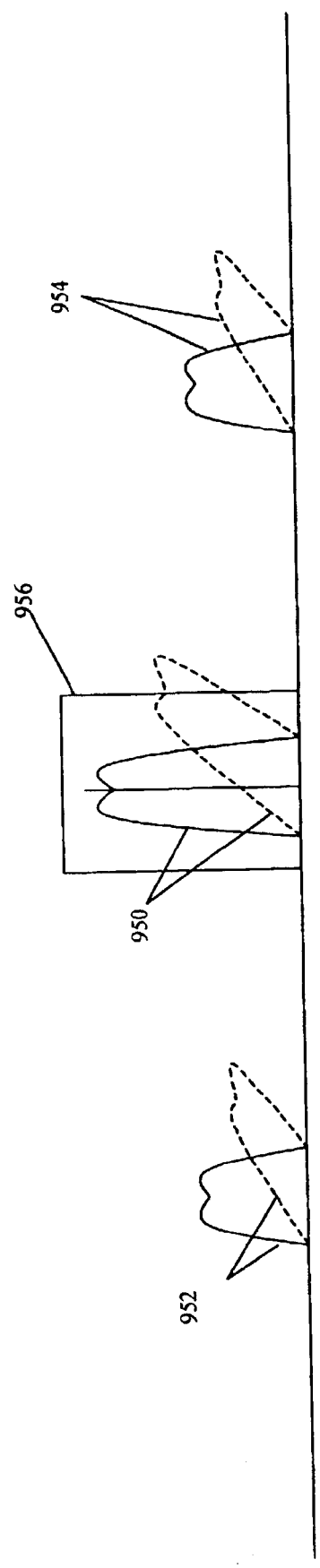
Figure 9F:
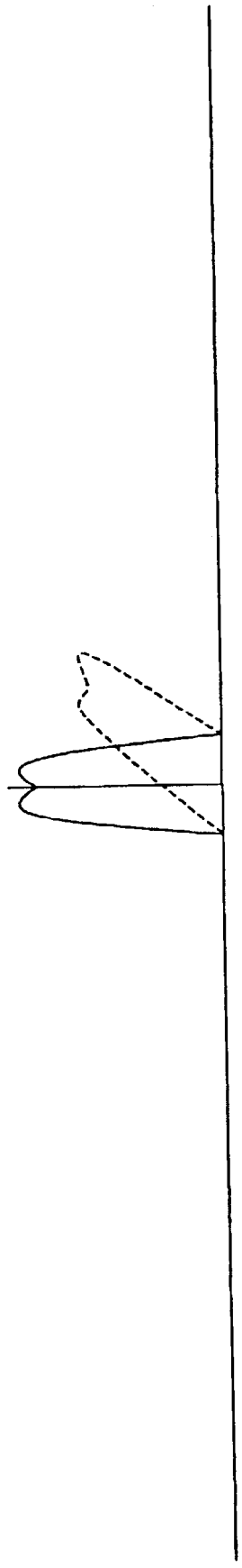

The complex demodulated signal is shown in FIG. 9E where we note the desired baseband signal 950 with other undesired signals 952 and 954. The undesired signals 952 and 954 are filtered out by lowpass filters 850 and 852 to leave only the desired complex baseband signals 956 as shown in FIG. 9F. Amplifiers 854 and 856, of course, scale the signals shown in FIG. 9F. At this point the quadrature modulated signals are said to be modulated at zero IF. Thus, the remaining desired signals present at the outputs of amplifiers 854 and 856 are very close approximations of the original I and Q baseband signals present at the output of amplifiers 812 and 814. For clarity, the approximations are referred to as I' and Q' and the original signals are referred to as I and Q as shown in FIG. 8. With these approximations, I' and Q', synthesizer 864 with a wide tuning range can be used in conjunction with components 858 and 864 to modulate the I' and Q' signals to a desired RF signal appropriate for microwave communications.

It should be noted that circuit delays, including cable delay, can cause the constellation pair (I',Q') to appear rotated with respect to the originating constellation pair (I, Q). The low pass filters 850 and 852, which are wide enough to pass the widest signal frequency, are needed to remove the double frequency components from the demodulator. Low data rates that result in lower bandwidths can therefore use low pass filters with the same bandwidth as for the wideband signals.

Figure 10A:
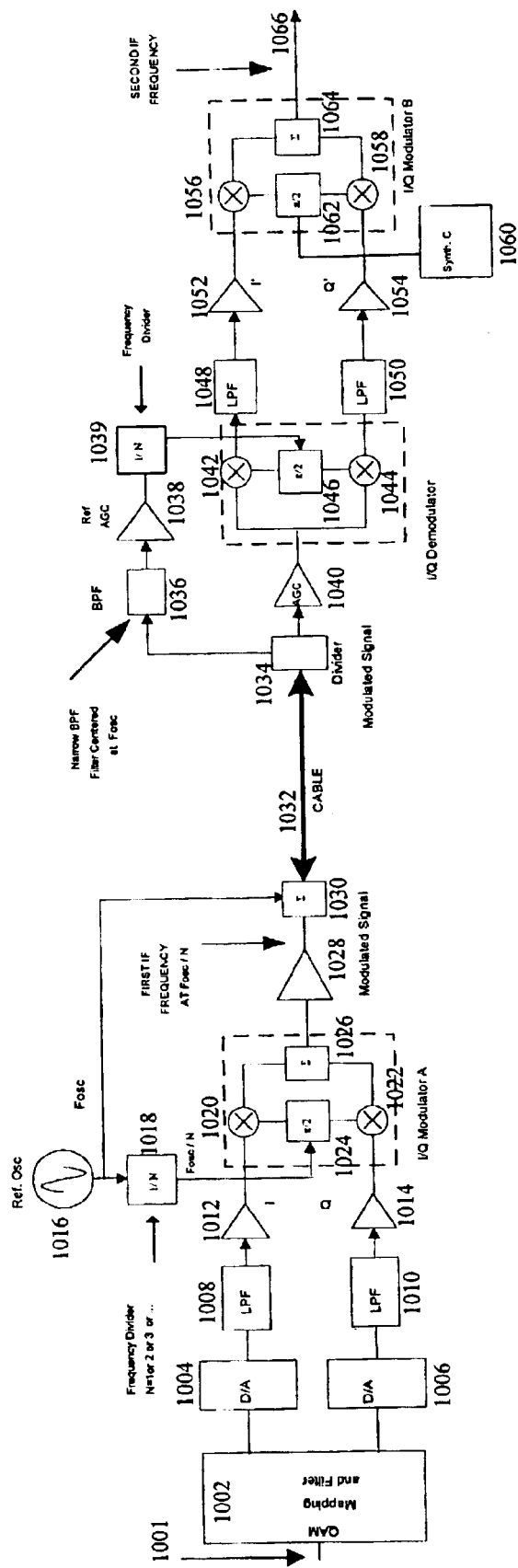
FIG. 10A is a block diagram of a second embodiment of a system for implementing zero IF re-modulation according to the present invention.

In a second embodiment of the invention shown in FIG. 10A, the oscillator frequency ($F_{osc}$) signal, 1016, is transmitted over the cable, for use in demodulation, along with the modulated signal at the first IF frequency. To produce the first IF frequency, the oscillator frequency is divided by an integer, N, which can take on values of 1, 2, 3, etc. As N increases for a fixed first IF frequency, the $F_{osc}$ signal 1016 increases. In other words, $F_{osc}$=N×(First IF frequency). For example, if N=1, the periodic signal from oscillator 1016 is in the passband of the modulated signal at the output of amplifier 1028, and is also transmitted over cable 1032. Higher values of N may place the frequency of oscillator 1016 outside the passband of the modulated signal as seen at the output of summer 1030. Both signals are provided to summer 1030. The spectral content of the signals transmitted over cable 1032 is as shown in FIG. 11. At the opposite end of the cable 1032, narrow filter 1036 is used to extract the periodic signal which is amplified by AGC 1038, divided by signal divider 1039, and then used in conjunction with components 1042 through 1054, in a similar manner as described with reference to FIG. 8, to demodulate the received signal to zero IF. In the embodiment of FIG. 10A, the periodic signal is preferably transmitted with amplitude significantly greater than the modulated signal for easier bandpass filtering.

Figure 10B:
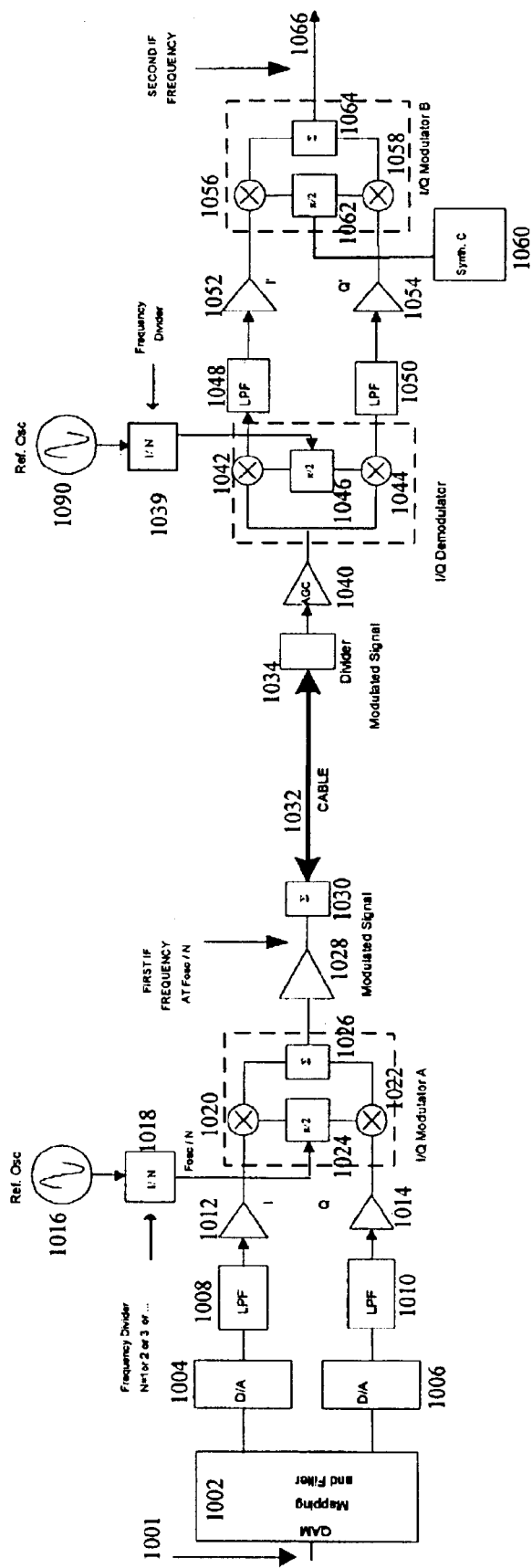
FIG. 10B is a block diagram of a third embodiment of a system for implementing zero IF re-modulation according to the present invention.

In yet another embodiment shown in FIG. 10B, rather than transmitting a reference oscillator or modulation signal on cable 1032, each zero IF demodulator locks on to its own reference oscillator 1016 and 1090. The rest of the block diagram of FIG. 10B is essentially the same as that of FIG. 10A. It should be noted that because slight frequency errors may occur in generating individual reference oscillator signals, this embodiment may provide less optimal results, but nonetheless quite functional. Whereas RF and microwave applications have been mentioned, it is noted that the present invention can be used for any modulated signal that can have a quadrature representation at zero IF, such as FM, QAM, or PSK (phase shift keying), for instance. It can also simplify some frequency hopping systems.

The use of a reference oscillator helps solve the signal deterioration problem of I/Q and quadrature imbalances by locking two synthesizers to one reference oscillator frequency so that a down stream demodulator can correct these impairments. Although signal deterioration may still be present, tests have shown that the downstream demodulator with the appropriate and adaptive correction technology widely used in many demodulators can more easily correct them. It is assumed that the receiver, or demodulator, used at the signal's ultimate destination can remove residual quadrature error or gain imbalances seen in practical applications of the present invention. Therefore, an important advantage of the present invention is that it preserves the advantage of direct modulation, for example, facilitating a wide tuning range in a second IF and eliminating the need for image rejection filtering. The present invention also addresses problems with direct modulation, for example, the need for data and clock regeneration at the destination end of a cable.

The present invention provides a way for quadrature modulated data at an arbitrary first IF frequency to be transported over a sizeable length of cable (1000 feet for instance) and to be converted to an arbitrary second IF frequency at the end of the cable without the limitations of image filtering used in heterodyne approaches. Another advantage is that there is no need for data and clock regeneration at the cable end as in the direct modulation approach. Accordingly, the present invention provides for arbitrary first and second IF frequencies. Moreover, no image rejection filtering is required. Indeed, wide band data transmission is possible over cable because the primary modulation is done at the head end of the cable. Also, a wide tuning range of the second IF frequency is achieved with relatively low cost components.

Figure 12:
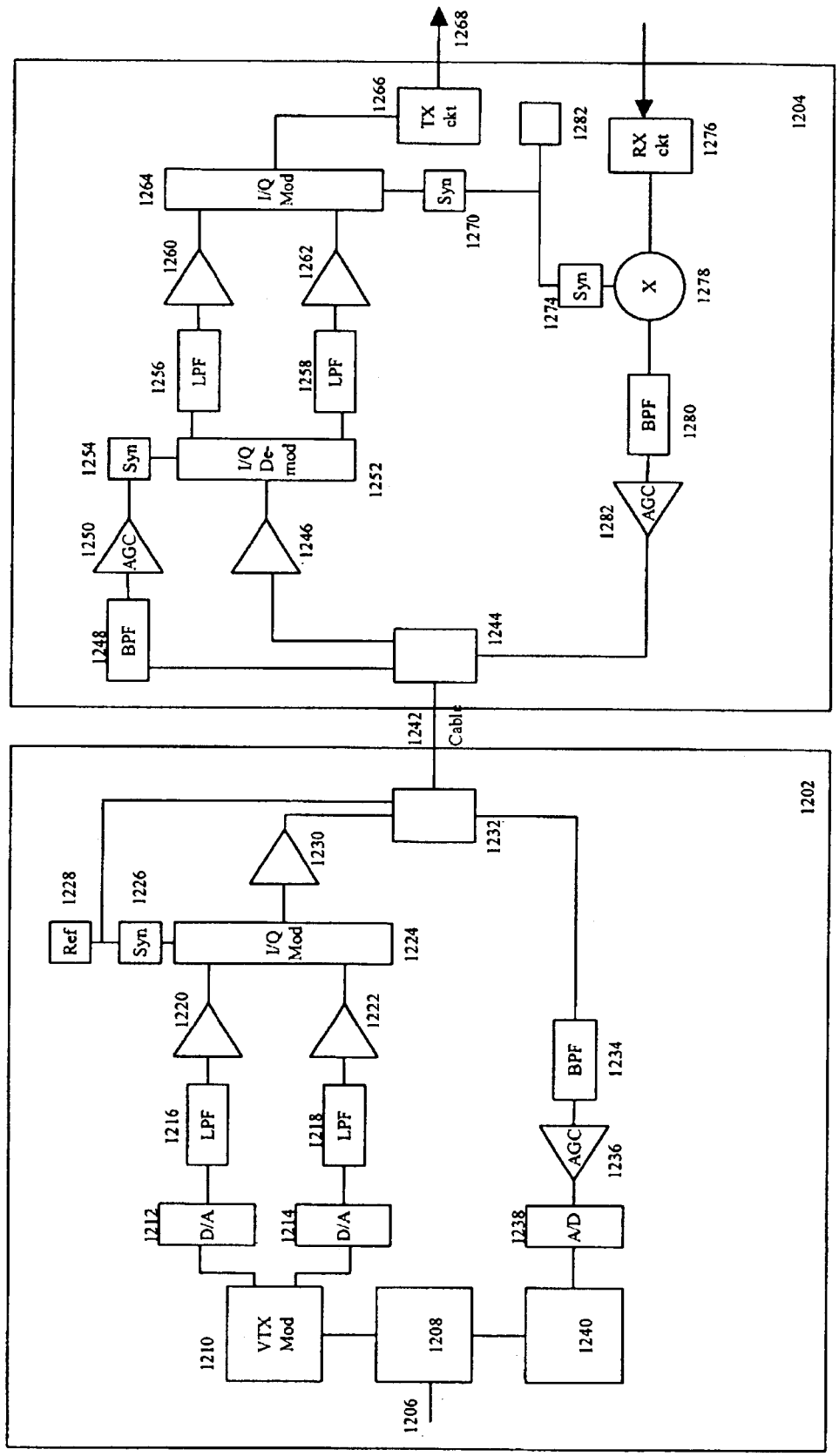
FIG. 12 is a block diagram of a preferred embodiment of a system for implementing zero IF re-modulation according to the present invention wherein a bi-directional frequency division multiplexing (FDM) application is shown with signals at two different frequencies.
Figure 13:
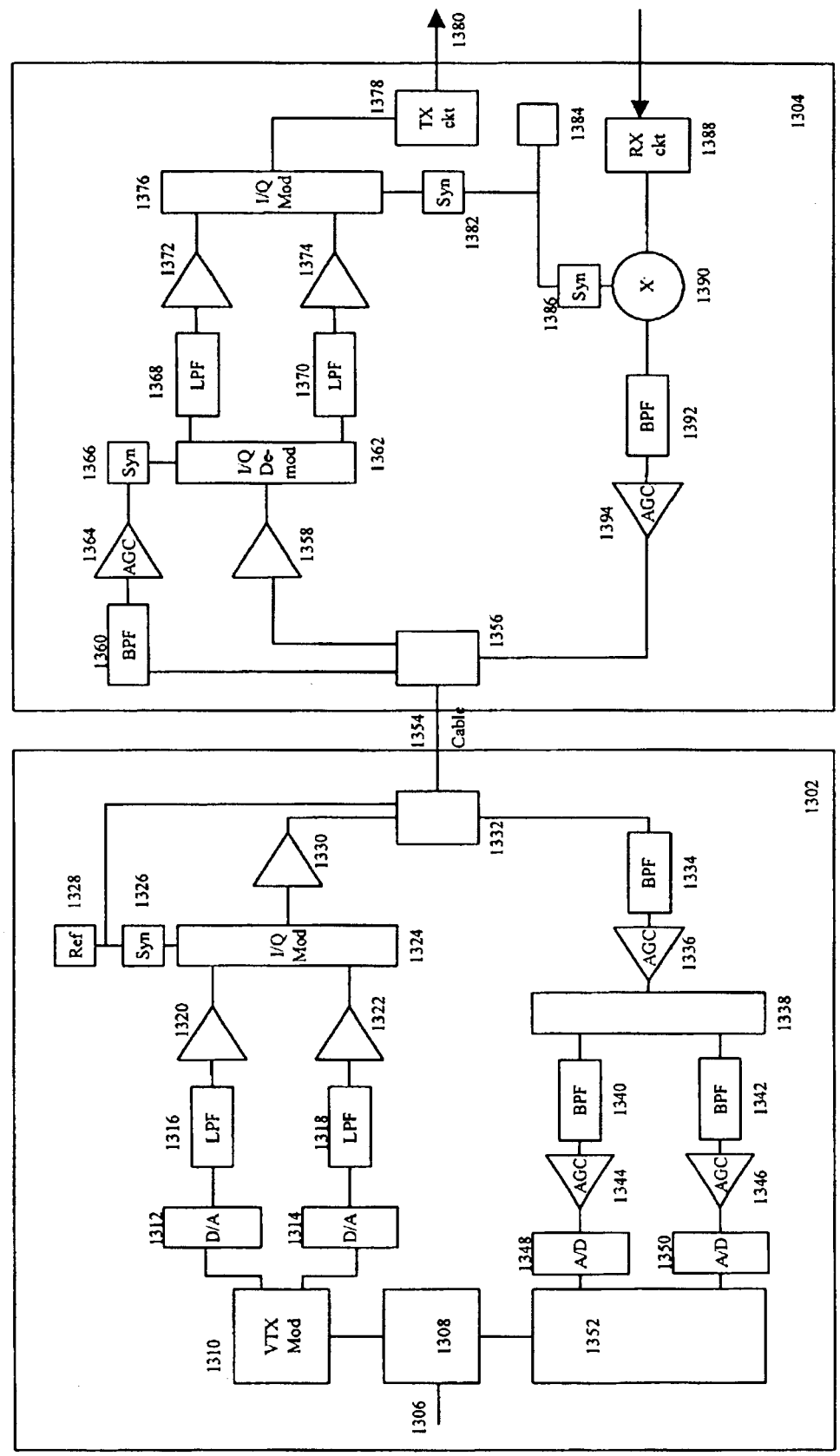
FIG. 13 is a block diagram of another preferred embodiment of a system for implementing zero IF re-modulation according to the present invention wherein a bi-directional frequency division multiplexing (FDM) application is shown with signals at two different frequencies.

Two preferred embodiments of the present invention are shown in FIGS. 12 and 13. The embodiment of FIG. 12 is used for passing wide-bandwidth signals at two different IF frequencies between and IDU and ODU. The embodiments shown can be implemented, for example, as QAM modulation with symbol rates at 1×STM−1 (one channel of Synchronous Transfer Mode-1). The embodiment of FIG. 13 is similar to that of FIG. 12 with some key differences, most notably 2×STM1 capability. In upgrading the embodiment of FIG. 12 to the 2×STM−1 scheme of FIG. 13, no changes to the ODU are needed. Note that STM-1 operates at a gross data rate of 155.52 Mbps such that 1×STM−1 provides data at such data rate and 2×STM−1 at twice such data rate. The embodiments of the present invention to be described provide cost and power advantages over the prior art and preserve a simplified wide tuning range of the transmitter.

In the embodiment shown in FIG. 12 note that within IDU 1202 the IDU Bus 1206 and IDU interface 1208 provide digital data to QAM mapping and filter module 1210 in a manner consistent with FIGS. 8 and 10. Here, note that QAM mapping and filter module 1210 is a VANTEX chip produced by Stratex Networks of San Jose, Calif. Also appropriate are other QAM receivers with adaptive equalization capable of correcting quadrature errors and I/Q imbalances. The operation of components 1212 through 1232 also have direct correspondence to FIG. 8 such that it is readily understood a modulated signal and a reference oscillator signal are carried on cable 1212. With regard to modulator 1224, note that it is set to baseband mode. As shown, reference oscillator 1228 operates at 10.7 MHz and the I and Q signals are modulated using a 310 MHz signal generated by synthesizer 1226. Demodulation in ODU 1204 is accomplished by components 1244 through 1262 in much the same manner as described with reference to FIG. 8. In the ODU 1204, after amplification, the received signal is demodulated to a zero frequency IF with an inexpensive I/Q quadrature demodulator 1252 and a using synthesizer 1254 operating at 310 MHz. Notice that this PLL uses the same 10.7 MHz reference as the one in the IDU 1202. The reference frequency at 10.7 MHz can be easily filtered by an inexpensive ceramic filter 1248, which is the reason for choosing that reference frequency. In FIG. 12, further detail is shown with regard to the manner of modulating the zero IF signals, I' and Q', that are present at the output of amplifiers 1260 and 1262. As shown, modulator 1264 modulates the I' and Q' signals to an appropriate RF and then directs such signals to transmitter circuit 1266 which then provides transceiver signal 1268. Importantly because of the close matching of the periodic signal in IDU 1202 and ODU 1204, the resulting zero IF signals, I' and Q', will not be constantly changing in phase (sometimes called rotating). Instead, there is a fixed phase angle of rotation on the signal dependent upon IDU 1202 to ODU 1204 cable length.

As shown in FIG. 12, certain receiver components are also shown because transceiver signal 1284 may also carry a received signal containing communications information. Components 1270 through 1282 are used to down convert to a 125 MHz IF. The received signal is sent down the cable to IDU 1202 where it is demodulated using components 1234 through 1240. After demodulation at demodulator 1240, digital information is passed through IDU interface 1208 and, in turn, to IDU bus 1206.

For higher data rates, the embodiment of FIG. 13 is used, because the Vantex receiver chip must operate in the baseband mode. Notice that IDU 1302 has no significant change except for baseband filters 1340 and 1342 that might have to be switch selectable in bandwidth to accommodate various high data rate wide bandwidths signals, but no manufacturing change would be required. Importantly, no changes are needed in ODU 1304, except to pass the widest bandwidth signal. Moreover, because demodulation components are typically contained on a plug-in card, IDU 1302 is configured to simply accept multiple, demodulator cards containing, for example, components 1340 through 1350.

Accordingly, the foregoing describes various embodiments of a system and method that provide for zero IF demodulation and re-modulation. Specifically, the present invention provides for generating modulated I and Q signals at a first frequency for transmission over a medium. Moreover, the present invention provides for also transmitting a periodic signal or a signal used to produce such periodic signal over the same medium. At a destination, demodulating circuitry uses the received periodic signal (or the received signal used to produce the periodic signal) to demodulate the received modulated signal. Importantly, the present invention demodulates the received modulated signal to zero IF such that approximations, I' and Q', are generated of the original I and Q signals. With such approximations, re-modulation at another arbitrary frequency is possible using relatively inexpensive components while providing for a wide modulation range.

Although this invention has been described in certain specific embodiments, variations to the embodiments would be apparent to those skilled in the art and those variations would be within the scope and spirit of the present invention. For instance, instead of transmitting over a cable, a different transmission medium, such as air, may be used. In using a different medium, it would be apparent to one of skill in the art that the modulation and re-modulation frequencies will need to be changed accordingly. Thus, the present embodiments of the invention should be considered in all respects as illustrative and not restrictive. The scope of the invention is indicated by the appended claims and their equivalents rather than the foregoing description.

What is claimed is:

1. An apparatus, comprising:
   a reference oscillator configured to generate a reference oscillator signal at a first frequency;
   a first frequency changing device configured to generate a first version of a periodic signal at a second frequency based on the reference oscillator signal;
   an input signal having a first spectral content;
   a first modulator coupled to receive the first version of the periodic signal and the input signal, wherein the modulator is configured to produce a first modulated signal;
   a signal assembler configured to assemble the reference oscillator signal and the first modulated signal;
   a transmission medium configured to carry the assembled first modulated and reference oscillator signals;
   a signal disassembler receiving from the transmission medium the assembled reference oscillator and first modulated signals, the signal disassembler providing a representation of the reference oscillator signal;
   a second frequency changing device configured to generate a second version of the periodic signal at the second frequency based on the representation of the reference oscillator signal;
   a demodulator coupled to the signal disassembler, wherein the demodulator is configured to demodulate the first modulated signal using the second version of the periodic signal to produce an approximation of the input signal.

2. The apparatus of claim 1, wherein the first frequency changing device is selected from a group consisting of a synthesizer and a frequency divider.

3. The apparatus of claim 1, wherein the second frequency changing device is selected from a group consisting of a synthesizer and a frequency divider.

4. The apparatus of claim 1, further comprising a second modulator for modulating the approximation of the input signal at a third frequency.

5. The apparatus of claim 1, further comprising an amplifier configured to amplify the first modulated signal and the reference oscillator signal.

6. The apparatus of claim 1, wherein the input signal is a quadrature amplitude modulated (QAM) signal.

7. The apparatus of claim 1, wherein the transmission medium is selected from a group consisting of a wire, air, and vacuum.

8. The apparatus of claim 1, wherein the signal assembler includes a device selected from a group consisting of a summer and an N-plexer.

9. The apparatus of claim 1, wherein the signal disassembler includes a device selected from a group consisting of a bandpass filter and an N-plexer.

10. An apparatus, comprising:
    a first reference oscillator configured to generate a first reference oscillator signal at a first frequency;
    a first frequency changing device configured to generate a first version of a periodic signal at a second frequency based on the first reference oscillator signal;
    an input signal having a first spectral content;
    a first modulator coupled to receive the first version of the periodic signal and the input signal, wherein the modulator is configured to produce a first modulated signal;
    a transmission medium configured to carry the first modulated signal;
    a second reference oscillator configured to generate a second reference oscillator signal at a frequency substantially equal to the first frequency;
    a second frequency changing device configured to generate a second version of the periodic signal at a frequency substantially equal to the second frequency based on the second reference oscillator signal;
    a demodulator configured to demodulate a representation of the first modulated input signal using the second version of the periodic signal to produce an approximation of the input signal.

11. The apparatus of claim 10, wherein the first frequency changing device is selected from a group consisting of a synthesizer and a frequency divider.

12. The apparatus of claim 10, wherein the second frequency changing device is selected from a group consisting of a synthesizer and a frequency divider.

13. The apparatus of claim 10, further comprising a second modulator for modulating the approximation of the input signal at a second frequency.

14. The apparatus of claim 10, further comprising an amplifier for amplifying the representation of the first modulated input signal.

15. The apparatus of claim 10, wherein the input signal is a quadrature amplitude modulated (QAM) signal.

16. The apparatus of claim 10, wherein the transmission medium is selected from a group consisting of a wire, air, and vaccum.

17. A method for processing a signal, comprising:
    generating a reference oscillator signal at a first frequency;
    generating a first version of a periodic signal at a second frequency using the reference oscillator signal;
    generating an input signal having a first spectral content;
    modulating the input signal using the first version of the periodic signal to produce a first modulated input signal;
    assembling the reference oscillator signal and the first modulated input signal;

transmitting the assembled first modulated input and the reference oscillator signals over a transmission medium;

disassembling the transmitted assembled reference oscillator and first modulated input signals to provide a representation of the reference oscillator signal;

generating a second version of the periodic signal at the second frequency using the representation of the reference oscillator signal;

demodulating a representation of the first modulated input signal using the received reference oscillator signal to produce an approximation of the input signal.

18. The method of claim 17, wherein generating the first version of the periodic signal includes synthesizing the reference oscillator signal.

19. The method of claim 17, wherein generating the first version of the periodic signal includes dividing the first frequency of the reference oscillator signal.

20. The method of claim 17, wherein generating the second version of the periodic signal includes synthesizing the representation of the reference oscillator signal.

21. The method of claim 17, wherein generating the second version of the periodic signal includes dividing a frequency of the representation of the reference oscillator signal.

22. The method of claim 17, further comprising modulating the approximation of the input signal at a third frequency.

23. The method of claim 17, further comprising amplifying the representation of the first modulated input signal and the periodic signal.

24. The method of claim 17, wherein the input signal is a quadrature amplitude modulated (QAM) signal.

25. The method of claim 17, wherein transmitting is achieved over a medium selected from a group consisting of a wire, air, and vacuum.

26. A method for processing a signal, comprising:
generating a first reference oscillator signal at a first frequency;
generating a first version of a periodic signal at a second frequency using the reference oscillator signal;
generating an input signal having a first spectral content;
modulating the input signal using the first version of the periodic signal to produce a first modulated input signal;
transmitting first modulated input signal over a transmission medium;
generating a second reference oscillator signal at a frequency substantially equal to the first frequency;
generating a second version of the periodic signal at a frequency substantially equal to the second frequency using the second reference oscillator signal;
demodulating a representation of the first modulated input signal using the second version of the periodic signal to produce an approximation of the input signal.

27. The method of claim 26, wherein generating the first version of the periodic signal includes synthesizing the first reference oscillator signal.

28. The method of claim 26, wherein generating the first version of the periodic signal includes dividing the first frequency of the first reference oscillator signal.

29. The method of claim 26, wherein generating the second version of the periodic signal includes synthesizing the second reference oscillator signal.

30. The method of claim 26, wherein generating the second version of the periodic signal includes dividing the frequency substantially equal to the first frequency of the second reference oscillator signal.

31. The method of claim 26, further comprising modulating the approximation of the input signal at a second frequency.

32. The method of claim 26, further comprising amplifying the transmitted assembled first modulated input signal and the reference oscillator signal.

33. The method of claim 26, wherein the input signal is a quadrature amplitude modulated (QAM) signal.

34. The method of claim 26, wherein transmitting is achieved over a medium selected from a group consisting of a wire, air, and vacuum.

35. An apparatus, comprising:
means for generating a reference oscillator signal at a first frequency;
means for generating a first version of a periodic signal at a second frequency using the reference oscillator signal;
means for generating an input signal having a first spectral content;
means for modulating the input signal using the first version of the periodic signal to produce a first modulated input signal;
means for assembling the reference oscillator signal and the first modulated input signal;
means for transmitting the assembled first modulated input and the reference oscillator signals over a transmission medium;
means for disassembling the transmitted assembled reference oscillator and first modulated input signals to provide a representation of the reference oscillator signal;
means for generating a second version of the periodic signal at the second frequency using the representation of the reference oscillator signal;
means for demodulating a representation of the first modulated input signal using the received reference oscillator signal to produce an approximation of the input signal.

36. The method of claim 35, wherein the means for generating the first version of the periodic signal includes means for synthesizing the reference oscillator signal.

37. The method of claim 35, wherein the means for generating the first version of the periodic signal includes means for dividing the first frequency of the reference oscillator signal.

38. The method of claim 35, wherein the means for generating the second version of the periodic signal includes means for synthesizing the representation of the reference oscillator signal.

39. The method of claim 35, wherein the means for generating the second version of the periodic signal includes means for dividing a frequency of the representation of the reference oscillator signal.

40. The apparatus of claim 35, further comprising means for modulating the approximation of the input signal at a third frequency.

41. The apparatus of claim 35, further comprising means for amplifying the representation of the first modulated input signal.

42. The apparatus of claim 35, wherein the input signal is a quadrature amplitude modulated (QAM) signal.

43. The apparatus of claim 35, wherein the means for transmitting is achieved over medium chosen from a group consisting of a wire, air, and vacuum.

44. An apparatus, comprising:

means for generating a first reference oscillator signal at a first frequency;

means for generating a first version of a periodic signal at a second frequency using the reference oscillator signal;

means for generating an input signal having a first spectral content;

means for modulating the input signal using the first version of the periodic signal to produce a first modulated input signal;

means for transmitting first modulated input signal over a transmission medium;

means for generating a second reference oscillator signal at a frequency substantially equal to the first frequency;

means for generating a second version of the periodic signal at a frequency substantially equal to the second frequency using the second reference oscillator signal;

means for demodulating a representation of the first modulated input signal using the second version of the periodic signal to produce an approximation of the input signal.

45. The method of claim 44, wherein the means for generating the first version of the periodic signal includes means for synthesizing the first reference oscillator signal.

46. The method of claim 44, wherein the means for generating the first version of the periodic signal includes means for dividing the first frequency of the first reference oscillator signal.

47. The method of claim 44, wherein the means for generating the second version of the periodic signal includes means for synthesizing the second reference oscillator signal.

48. The method of claim 44, wherein the means for generating the second version of the periodic signal includes means for dividing the frequency substantially equal to the first frequency of the second reference oscillator signal.

49. The apparatus of claim 44, further comprising means for modulating the approximation of the input signal at a second frequency.

50. The apparatus of claim 44, further comprising means for amplifying the representation of the first modulated input signal.

51. The apparatus of claim 44, wherein the input signal is a quadrature amplitude modulated (QAM) signal.

52. The apparatus of claim 44, wherein the means for transmitting is achieved over medium selected from a group consisting of a wire, air, and vacuum.

* * * * *